(12) United States Patent
Furukawa et al.

(10) Patent No.: US 7,330,490 B2
(45) Date of Patent: Feb. 12, 2008

(54) OPTICAL WAVELENGTH CONVERTER AND IMAGE FORMING APPARATUS USING THE SAME

(75) Inventors: Yukio Furukawa, Mountain View, CA (US); Takashi Yuasa, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/474,998

(22) Filed: Jun. 27, 2006

(65) Prior Publication Data

US 2007/0002909 A1 Jan. 4, 2007

(30) Foreign Application Priority Data

Jun. 30, 2005 (JP) ............................. 2005-190816
Mar. 7, 2006 (JP) ............................. 2006-061926

(51) Int. Cl.
H01S 3/10 (2006.01)
H01S 3/00 (2006.01)

(52) U.S. Cl. ..................... 372/21; 372/22; 372/38.07

(58) Field of Classification Search .................. 372/21, 372/22, 38.07
See application file for complete search history.

(56) References Cited

U.S. PATENT DOCUMENTS

| 6,738,398 B2 | 5/2004 | Hirata et al. ................ 372/32 |
| 7,039,077 B2 | 5/2006 | Furukawa et al. ........... 372/21 |
| 2006/0198006 A1 | 9/2006 | Kato et al. ................. 359/224 |
| 2007/0002909 A1 | 1/2007 | Furukawa et al. ........... 372/22 |

FOREIGN PATENT DOCUMENTS

| JP | 2002-43698 | 2/2002 |
| JP | 3329446 | 7/2006 |

OTHER PUBLICATIONS

Abstract for corresponding Japanese application No. 2001-125156.

*Primary Examiner*—Armando Rodriguez
(74) *Attorney, Agent, or Firm*—Fitzpatrick, Cella, Harper & Scinto

(57) ABSTRACT

An optical wavelength converter includes a distributed Bragg reflector laser having an active area, a phase area, and a distributed Bragg reflector area in which a distributed Bragg reflector is formed; an optical wavelength conversion device for receiving fundamental wave light emitted from said distributed Bragg reflector laser and outputting second harmonic wave light of the fundamental wave light; and a control circuit for controlling an emission wavelength and a light output by controlling an injection current to be injected into the distributed Bragg reflector laser for each period. The control circuit controls the injection current to be injected into the distributed Bragg reflector laser while satisfying a condition for controlling a light output mode of the distributed Bragg reflector laser so that light energy to be inputted into the optical wavelength conversion device in each period is constant and satisfying a condition for injecting a current into each of an active area, a phase area, and a distributed Bragg reflector area in each of periods in a mode of constant amount of generated heat so that an injection current-emission wavelength characteristic in the distributed Bragg reflector area is constant.

11 Claims, 20 Drawing Sheets

US 7,330,490 B2

OPTICAL WAVELENGTH CONVERTER AND IMAGE FORMING APPARATUS USING THE SAME

FIELD OF THE INVENTION AND RELATED ART

The present invention relates to an optical waveform converter and an optical wavelength conversion method which are used for converting semiconductor laser light into second harmonic. Particularly, the present invention relates to a laser light-emitting optical waveform converter, capable of being driven at high speed, utilized as a light source for laser display, electrophotographic image formation, optical recording, optical measurement, etc., and relates to an optical wavelength conversion method. The present invention further relates to a control method of such an optical waveform converter and an image forming apparatus, using the optical waveform converter, such as a laser display, a laser beam printer, etc.

A semiconductor laser has been utilized in various fields including optical communication system, CDs and DVDs, measuring instruments by utilizing its properties that it permits a small size, high output, and production at low cost. A blue-violet semiconductor laser has only recently been input into practical use but a semiconductor laser of a wavelength band of not more than green or ultraviolet region has not been commercialized as yet. Expectations for small-size lasers, of short wavelength with high output, which are applied to those of green as one of three primary colors, a laser processing machine, a high-density optical memory etc., are rising.

Against this backdrop, as a method of obtaining a short-wavelength laser light source, various methods using second harmonic generation (SHG) has been proposed. As an optical waveform conversion device (SHG device), periodically poled lithium niobate (PPLN) is generally used. Further, a wavelength selection range of the SHG device is ordinarily as narrow as not more than 1 nm, so that as a fundamental wave light source, a distributed feedback (DFB) laser and a distributed Bragg reflector (DBR) laser which are excellent in single mode performance and wavelength stability are used.

In the case where a modulated current is injected into such a semiconductor laser, the following problem has been known. More specifically, an emission wavelength fluctuates due to thermal history varying depending on a modulation pattern of the modulated current. As a result, an output of SHG light also fluctuates. In view of this problem, an SHG laser light source has been disclosed in Japanese Laid-Open Patent Application (JP-A) 2002-43698. FIG. 20 is a schematic view showing a constitution thereof. As shown in FIG. 20, the SHG laser light source includes a DBR (distributed Bragg reflector) semiconductor laser 810, an SHG device 820, and a drive circuit 830. The DBR semiconductor laser 810 has a DBR area 813, a phase (adjusting) area 812, and an active area 811. The drive circuit 830 controls an amount of injection current into the active area 811 and an amount of injection current into the phase area 812 so that the sum of an amount of heat conducted from the active area 811 to the DBR area 813 and an amount of heat conducted from the phase area 812 to the DBR area 813 is constant. As a result, a wavelength of the fundamental wave light from the DBR semiconductor laser 810 is stabilized, so that a modulation pattern dependency of SHG light (second harmonic light) from the SHG device is alleviated.

Further, in order to obtain a desired output of higher harmonic wave and stabilize the output with respect to the SHG laser light source including the DBR semiconductor laser and the optical waveform conversion device, a method of controlling each of values of current in the DBR area, the active area, and the phase area has also be proposed in Japanese Patent (JP-B) 3329446.

According to the method disclosed in JP-A 2002-43698, a degree of temperature change in the DBR area 813 by the modulated current pattern is decreased to some extent. However, the fundamental wave light is modulated by injecting the modulated current into the active area 811, so that light energy injected into the SHG device 820 is changed. For this reason, a temperature of the SHG device 820 is changed, so that a phase matching wavelength is not stabilized. As a result, an output of the SHG light from the SHG device 820 becomes unstable.

Further, the method proposed in JP-B 3329446 is a technique only regarding stabilization of light output in a continuous oscillation state, so that stabilization of light output driving modulation is not taken into consideration.

SUMMARY OF THE INVENTION

In view of the above described problems, an optical waveform converter according to the present invention comprises a DBR laser, an optical wavelength conversion device for receiving fundamental wave light emitted from said distributed Bragg reflector laser and outputting second harmonic wave light of the fundamental wave light, and a control circuit for controlling an emission wavelength and a light output by periodically controlling an injection current to be injected into the DBR laser. Here, the DBR laser has an active area, a phase area, and a DBR area in which a DBR (distributed Bragg reflector) is formed. The control circuit controls the injection current to be injected into the DBR laser while satisfying a first condition and a second condition, which are described below, to control an emission wavelength and a light output of the DBR laser, thus modulating an amount of the second harmonic light from the optical waveform conversion device. The first condition is such a condition that a light output mode of the DBR laser is controlled so that light energy to be inputted into the optical waveform conversion device in each period is constant. In other words, the first condition is such a condition that a wavelength dependency of SHG light output of the optical waveform conversion device as shown in FIG. 4 is not caused to occur. The second condition is such a condition that a current is injected into each of the active area, the phase area, and the DBR area in each of periods in a mode of constant amount of generated heat so that an injection current-emission wavelength characteristic in the DBR area is constant.

Herein, the term "constant" includes not only the case of being strictly constant but also the case of being substantially constant so long as a certain degree of effect is achieved. Further, "injection current-emission wavelength characteristic is constant" means that a relationship between the injection current and the emission wavelength with respect to the DBR area as shown in FIGS. 2A and 2C is not changed. Further, the "mode of constant amount of generated heat" means such a mode that a current is constant in a time period within one period including at least a time when light of a wavelength closest to a phase adjustment wavelength of the optical waveform conversion device is emitted from the DBR laser and an amount of heat generated by an injection current over one period is constant for each of period.

Further, in view of the above described problems, an optical wavelength conversion method according to the present invention controls an injection current to be injected into the DBR laser for each period to control an emission wavelength and a light output by causing fundamental light emitted from the DBR laser to enter the optical waveform conversion device to output second harmonic (wave) light. Here, the DBR laser has an active area, a phase area, and a DBR area in which a DBR (distributed Bragg reflector) is formed. In the conversion method, the injection current to be injected into the DBR laser is controlled while satisfying a first condition and a second condition, which are described below, to control an emission wavelength and a light output of the DBR laser, thus modulating an amount of the second harmonic light from the optical waveform conversion device. Also, in this case, the first condition is such a condition that a light output mode of the DBR laser is controlled so that light energy to be inputted into the optical waveform conversion device in each period is constant. Further, the second condition is such a condition that a current is injected into each of the active area, the phase area, and the DBR area in each of periods in a mode of constant amount of generated heat so that an injection current-emission wavelength characteristic in the DBR area is constant.

Further, in view of the above described problems, an image forming apparatus, such as a laser display or a laser beam printer, according to the present invention includes the above described optical waveform converter and at least one optical scanning device. Herein, scanning with light emitted by the optical waveform conversion device is effected by the optical scanning device to form an image.

According to the present invention, by a relatively simple control method, it is possible to ensure thermal stability of the DBR laser and the optical waveform conversion device to realize an optical waveform converter or an optical wavelength conversion method which are capable of stably effecting high-gradation control independent of a modulation signal pattern. Further, by using the optical waveform converter according to the present invention, it is possible to realize an image forming apparatus capable of forming also an image permitting high definition gradation expression.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Hereinbelow, an embodiment of the optical waveform converter or the optical wavelength conversion method according to the present invention will be described. The optical waveform converter of this embodiment includes a DBR laser, an optical waveform conversion device (SHG device) for receiving fundamental wave light emitted from the DBR laser and outputting second harmonic light resulting from the fundamental wave light, and a control circuit for controlling the DBR laser depending on some modulation signal. The DBR laser has an active area, a phase area, and a DBR area in which a DBR is formed. Herein, a constant current is injected into the active area, and a drive current injected into the DBR area or the phase area has a multi-valued wavelength having not less than three values (levels). The drive current having the multi-valued wavelength is set so as to provide a constant injection energy in one period.

Into the active area, the above described constant current over one period, i.e., a continuous constant current may be injected but a current may also be injected in another manner so long as the above described mode of constant amount of generated heat is ensured. For example, when the drive current injected into the DBR area or the phase area has one of the values of the multi-valued wavelength, the current to be injected into the active area may also be injected in the manner described below in the case where light of a wavelength closest to a phase adjustment wavelength of the optical waveform conversion device is emitted from the DBR laser and an injection time of the current is at most half of each period. More specifically, into the active area, a constant current may be injected for half of one period and a current having another value may be injected for remaining half of one period. This is because SHG light in a large amount of light (at bright level) is emitted from the optical waveform conversion device when the light having a wavelength closest to the phase adjustment wavelength of the optical waveform conversion device is emitted from the DBR laser and a stability of a wavelength of fundamental wave light from the DBR laser is the most required factor in order to ensure stable modulation and sufficiently large extinction ratio.

Figure 1A:
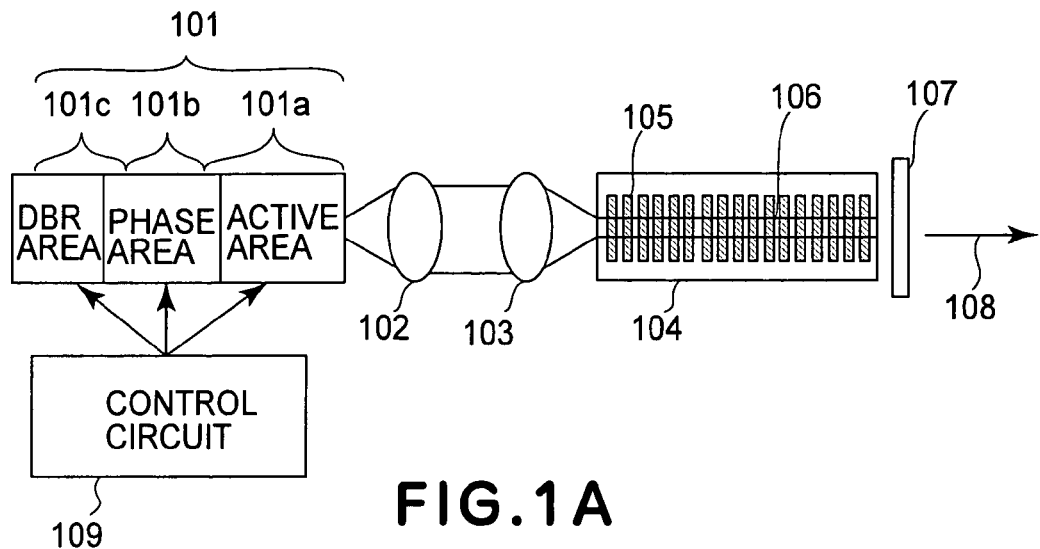
FIGS. 1A and 1B are schematic views for illustrating a constitution and an operation of an optical waveform converter in embodiments of Embodiments of the present invention.

Hereinbelow, description thereof will be made in detail. FIG. 1A is a schematic view showing a constitution of the optical waveform converter according to this embodiment. The optical waveform converter includes a semiconductor DBR laser 101, an active area 101a, a phase area 101b, a DBR area 101c, a collimator lens 102, a condensing lens 103, an SHG device 104, a polarization inversion area 105, an optical wavelength 106, a wavelength filter 107, SHG light 108, and a control circuit 109 for controlling an injection current to be injected into the DBR laser 101 depending on a modulation signal so as to control an emission wavelength and a light output of the DBR laser 101.

Figure 1B:
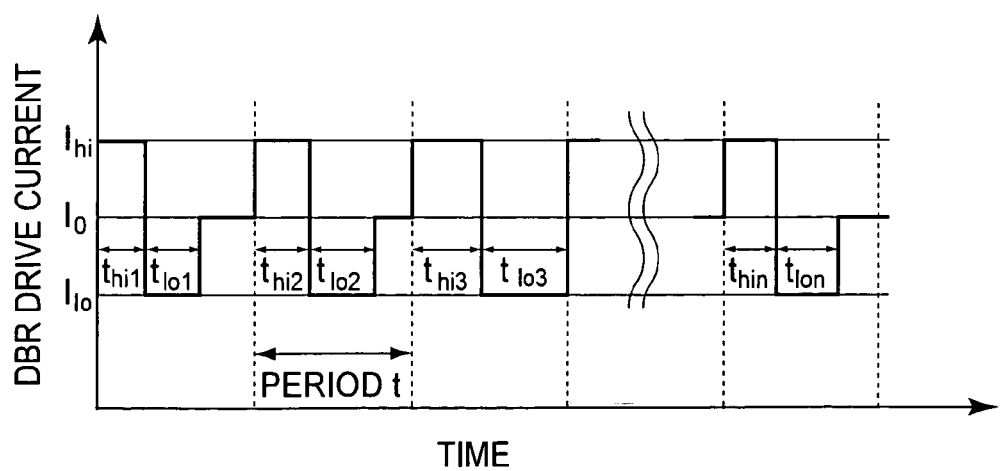

FIG. 1B is a schematic view showing a time chart of a drive current injected into the DBR area 101c. In this embodiment, a multi-valued drive current is injected into the DBR area 101c. Depending on a modulation signal, times (time periods) of injection of a high-level current $I_{hi}$ an intermediary-level current $I_0$, and a low-level current $I_{lo}$ are controlled for each period t. Here, drive voltages, in the DBR area, corresponding to the currents $I_{hi}$, $I_0$ and $I_{lo}$ are taken as $V_{hi}$, $V_0$, and $V_{lo}$, and times of injection of the currents $I_{hi}$, $I_0$, and $I_{lo}$ are taken as $t_{hin}$, $t-(t_{hin}+t_{lon})$, and $t_{lon}$ (n: arbitrary number representing the order of periods of modulation signal. In this case, the injection times are determined for each period so as to satisfy the following relationship (1):

$$(I_{hin} \times V_{hin} - I_0 \times V_0) \times t_{hin} = (I_0 \times V_0 - I_{lon} \times V_{lon}) \times t_{lon}. \quad (1)$$

This modulation method is a pulse width modulation (PWM). In the PWM, current values (multi-valued currents) are constant for each period and injection times for the currents are variable for each period depending on a modulation signal. By controlling the injection times in a pulse width modulation circuit of the control circuit 109, an amount of second harmonic light for each period is adjusted. According to this modulation method, it is only necessary to change only the time thin and the time $t_{lon}$ depending on the modulation signal, so that a constitution of the modulation circuit of the control circuit 109 can be relatively simplified.

In this case, an excessive amount of injection energy at time $t_{hin}$ is canceled (i.e., temperature-compensated) by a deficient amount of injection energy, so that energy (time integral of I×V) injected into the DBR area 101c is constant for each period. For this reason, an amount of heat generated in the DBR area 101c in one period is constant irrespective of modulation signal. In this case, the injection current injected into the active area and the injection current injected into the phase area are also controlled so that the sum of an amount of heat conducted from the active area 101a to the DBR area 101c and an amount of heat conducted from the phase area 101b to the DBR area 101c is constant. As a result, a relationship between an emission wavelength of the DBR laser 101 and a value of injection current injected into the DBR area 101c can be made constant, so that it is possible to stably control the emission wavelength depending on the modulation signal. Thus, it is possible to input light of a wavelength closest to the phase adjustment wavelength of the optical waveform conversion device and light of wavelength deviated from the phase adjustment wavelength into the SHG device 104 with good controllability. In this case, although the wavelength of incident light is changed for each period, the light energy inputted into the SHG device 104 in constant, so that a temperature of the SHG device 104 is also kept constant. As a result, a wavelength conversion efficiency of the SHG device 104 is also constant, so that it is possible to realize stable modulation of the SHG light 108 depending on the modulation signal.

Figure 2A:
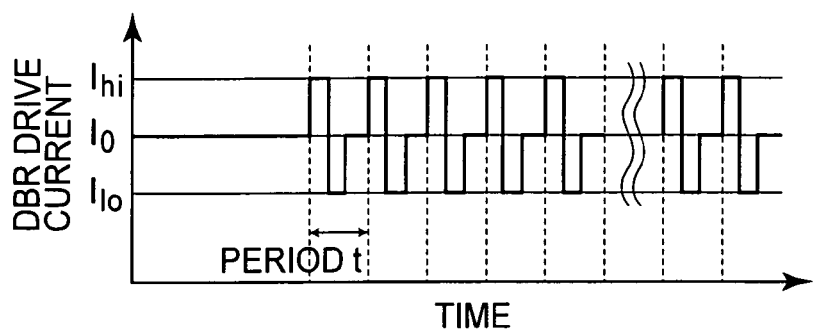
FIGS. 2A to 2D are time charts of a DBR drive current, a DBR area temperature, an emission wavelength, and an SHG light output, respectively, in an embodiment of the present invention.
Figure 2B:
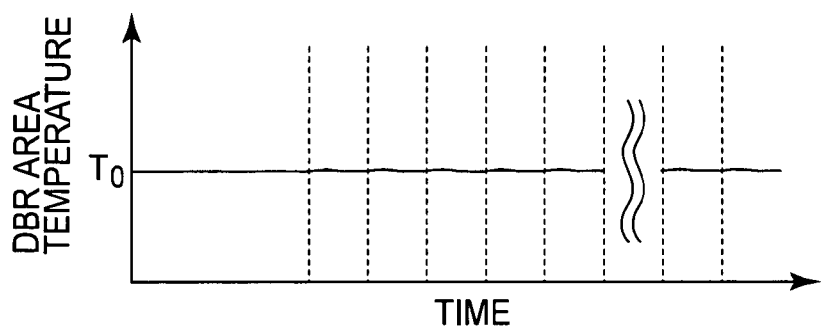
Figure 2C:
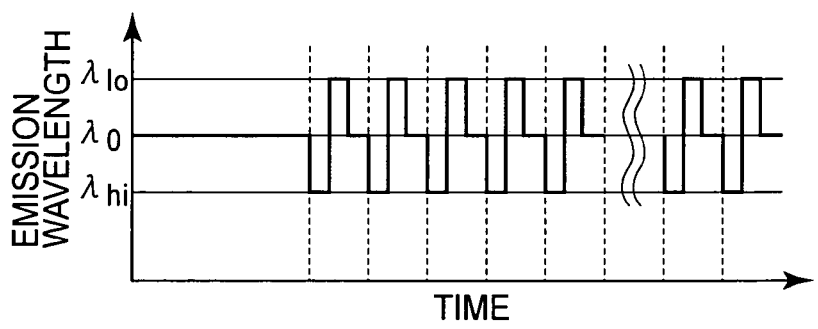
Figure 2D:
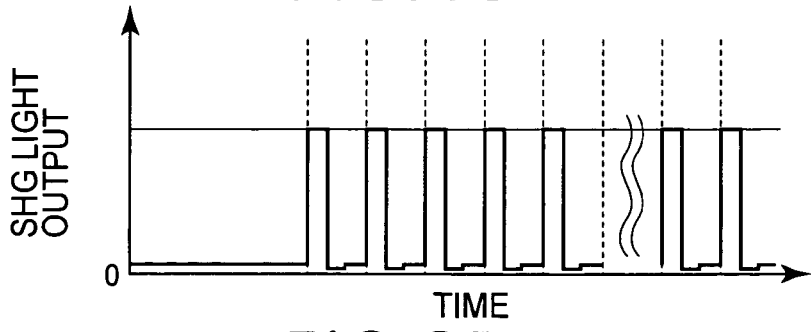

A further description will be made with reference to FIGS. 2A to 2D. The description will be made by taking, as an example, the case where a drive current is injected into the DBR area so that the same modulation pattern is repeated from a certain time so as to satisfy the above described conditions, as shown in FIG. 2A. In this case, an amount of generated heat is substantially identical to that before repetition of the modulation pattern, so that a temperature in the DBR area is almost constant (FIG. 2B). As a result, a change with time of the emission wavelength of the laser is stably constant as shown in FIG. 2C. When the current is increased (current $I_{hi}$), a refractive index of the DBR area is decreased due to carrier effect to decrease the emission wavelength (wavelength $\lambda_{hi}$). On the other hand, when the current is decreased (current $I_{lo}$, a refractive index of the DBR area is increased to increase the emission wavelength (wavelength $\lambda_{lo}$). However, in this case, even when the emission wavelength of the laser is changed with time, an light emission time is constant for each period, so that the light energy inputted into the SHG device is kept constant, thus resulting in a constant temperature. Accordingly, by adjusting the phase adjustment wavelength of the SHG device to the wavelength $\lambda_{hi}$, a constant output of the SHG light as shown in FIG. 2D is obtained.

Figure 3A:
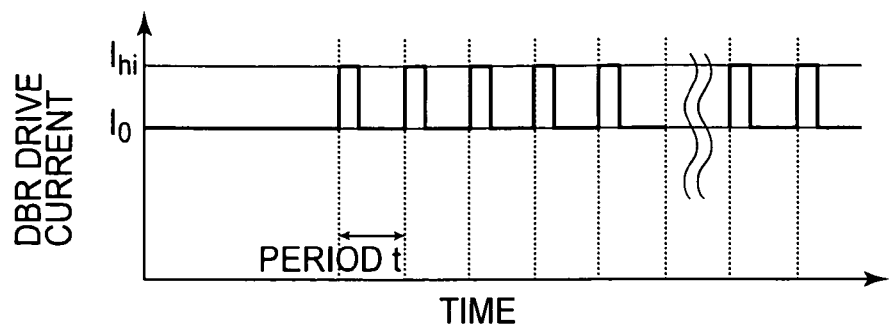
FIGS. 3A to 3D are time charts of a DBR drive current, a DBR area temperature, an emission wavelength, and an SHG light output, respectively, in a comparative embodiment of the present invention.
Figure 3B:
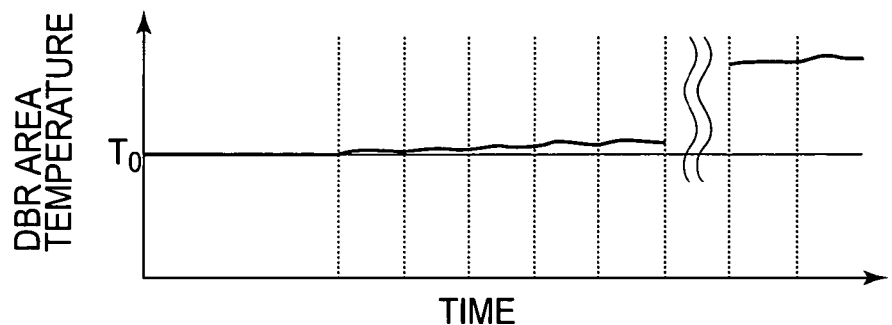
Figure 3C:
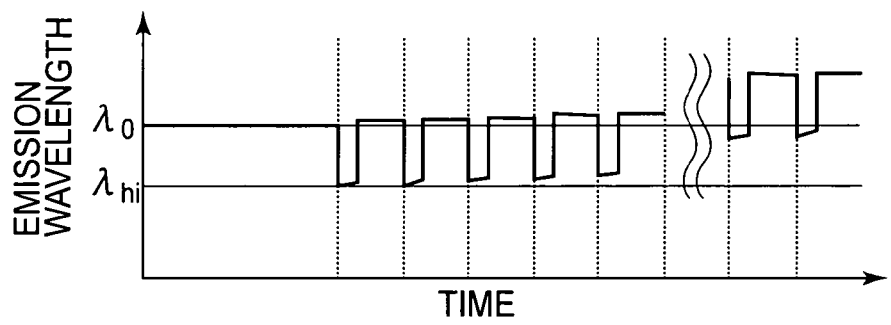
Figure 3D:
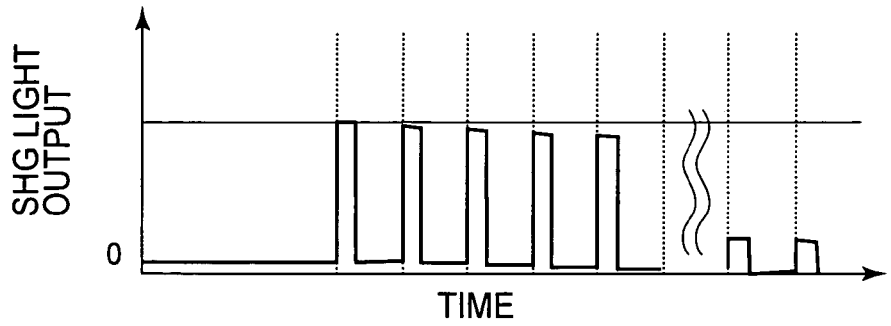

For comparison, the case where the drive current is injected into the DBR area in such a manner that a modulation pattern without taking temperature compensation into consideration is repeated from a certain time as shown in FIG. 3A will be described. In this case, an amount of generated heat is increased compared with that before the repetition of the modulation pattern, so that the temperature of the DBR area is gradually increased (FIG. 3B). As a result, as shown in FIG. 3C, a change with time of the laser emission wavelength is shifted to a longer wavelength side due to a combination of carrier effect and thermal effect. Thus, compared with an initial wavelength change mode in which the modulation pattern is started to be repeated, the wavelength change mode is largely changed after lapse of such a time that the influence of heat cannot be disregarded. Therefore, a conversion efficiency of the SHG device is changed with time, thus resulting in an unstable output of the SHG light as shown in FIG. 3D.

Similarly, also in the case of a random pulse with, a stable modulation of the SHG light cannot be realized by such a drive current that the temperature compensation is not taken into consideration as shown in FIG. 3A. On the other hand, it is possible to realize the stable modulation of the SHG light by such a drive current that the temperature compensation is taken into consideration as shown in FIG. 2A.

Further, as described above, the current injected into the active area is constant for each period, so that a light output of the DBR laser itself is always a substantially constant value in a light emission state. Further, even when the change mode of the light wavelength is changed light energy connected to the SHG device is not changed by the modulation pattern. Accordingly, independent of the modulation signal, the temperature of the SHG device is constant, so that the phase adjustment wavelength is not changed.

Further, the three-valued drive current wavelength is inputted into the DBR area in this embodiment. However, even in the case of a multi-valued wavelength having not less than four values (levels), similarly it is possible to provide a stable SHG output by determining current values and pulse time widths so that an average amount of generated heat is constant.

Further, also in the case where the multi-valued drive of not less than three values is effected in the phase area, not in the DBR area, the above-described conditions can be similarly set on the basis of the relationship between a current and a voltage in the phase area. Further, it is also possible to effect the multi-valued wavelength drive of not less than three values in both of the DBR area and the phase area. It is further possible to effect the multi-valued wavelength drive of not less than three values in one of the DBR area and the phase area and effect multi-valued wavelength drive of not less than two values in the other area. In this case, the drive current in one of the DBR area and the phase area is only required to be injected while being synchronized with the drive current in the other area at at least a time period including a time in which light of a wavelength closest to the phase adjustment wavelength of the optical waveform conversion device is emitted from the DBR laser, so that the two-valued wavelength drive can be realized in one area. As described above, it is possible to effect control of injection of drive current in such a manner that a second drive current having current values of not less than two values is injected into the phase area while being synchronized with a first drive current at at least a time period including a time in which one of modulation currents is injected.

It is desirable that an extinction ratio is larger. When the extinction ratio (a ratio of bright level to dark level) is not less than 10, it is particularly effective with respect to a display device such as a display. In this regard, it is important that a relationship between the injection current injected into the DBR area and the emission wavelength of the semiconductor laser is stable and the emission wavelength is modulated by the modulation signal with good controllability and that a temperature of the SHG device is stable and a wavelength dependency of the SHG light output determining the phase adjustment wavelength of the SHG device is stable. The above-described constitution satisfies these conditions.

In the above-described embodiment, the phase adjustment wavelength of the SHG device is adjusted to the wavelength $\lambda_{hi}$ but a similar effect can be achieved also in the case where the phase adjustment wavelength is adjusted to the wavelength $\lambda_{lo}$. Further, the phase adjustment wavelength may also be adjusted to the wavelength $\lambda_0$.

The wavelength of the DBR laser may be in any wavelength range so long as it permits oscillation as the DBR laser and nonlinear effect of the SHG device. The SHG device can employ nonlinear optical crystal such as $LiNbO_3$ (LN), $KNbO_3$ (KN), $KTiOPO_4$ (KTP), or $LiYaO_3$ (LT).

Hereinafter, Embodiments of the present invention will be described with reference to the drawings.

Embodiment 1

FIG. 1A shows a constitution of an optical waveform converter according to Embodiment 1 of the present invention. The optical waveform converter include a semiconductor DBR laser 101 has an active area 101a, a phase area 101b, and a DBR area 101c provided with a diffraction grating structure. In the phase area 101b and the DBR area 101c, an emission wavelength can be changed by passing a current through pn junction in a perpendicular direction to change a refractive index of an active layer.

A current is passed through the active area 101a, the phase area 101b, and the DBR area 101c by a control circuit 109 to concentrate fundamental wave laser light generated by the semiconductor DBR laser 101 at an SHG device through a collimator lens 102 and a condensing lens 103. The SHG device 104 is a waveguide-type quasi-phase adjustment device formed in a device length of 12 mm of $LiNbO_3$ and provided with an optical waveguide 106 including periodically formed polarization inversion areas 105. The SHG device 104 can convert the fundamental wave laser light into SHG light 108 having a wavelength which is half of the wavelength of the fundamental wave laser light. Both of the fundamental wave laser light and the SHG light are emitted from the SHG device 104, so that the fundamental wave laser light is cut by a wavelength filter 107.

Figure 4:
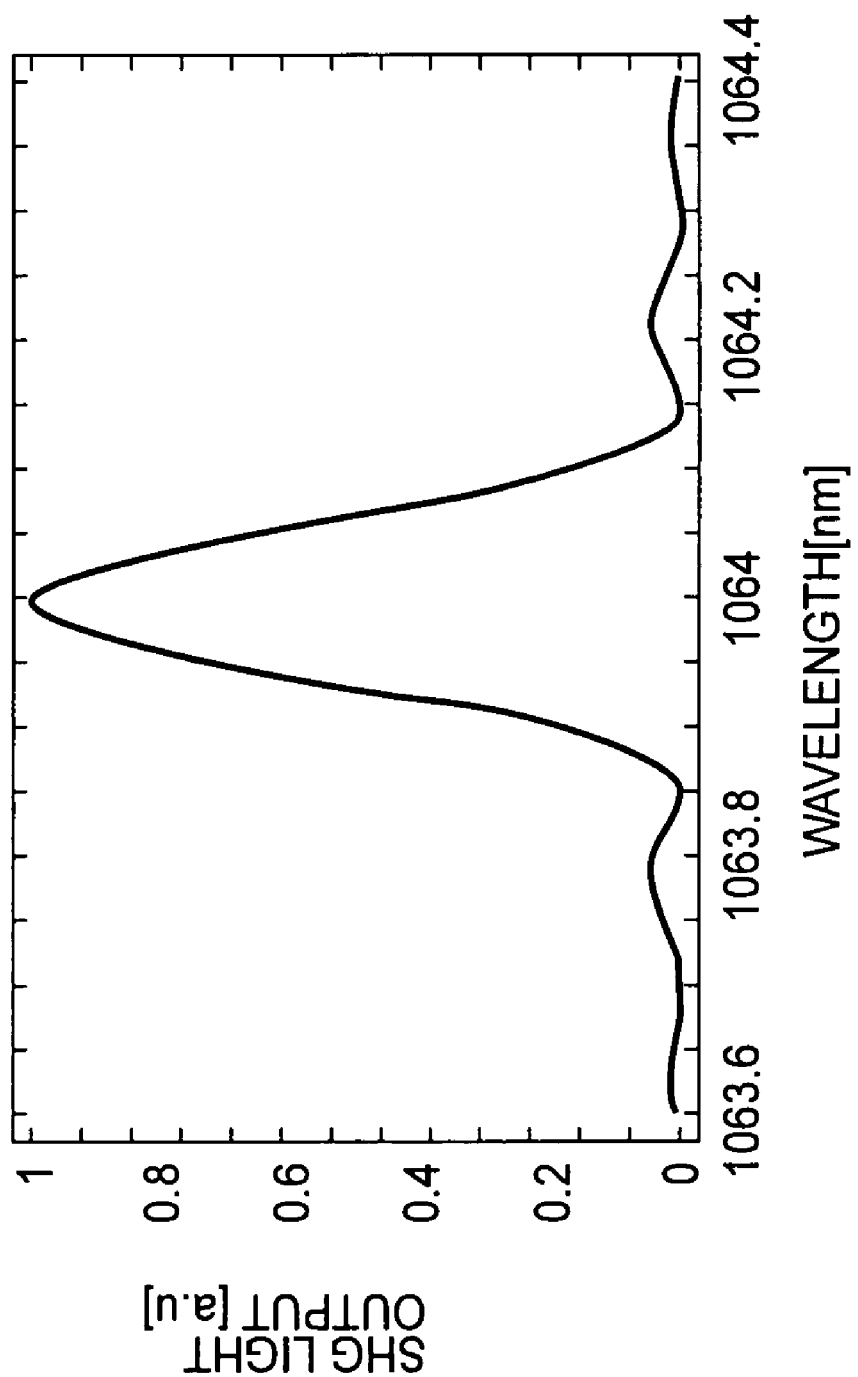
FIG. 4 is a graph showing a relationship between a wavelength of an SHG device and an SHG light output in an Embodiment of the present invention.
Figure 5:
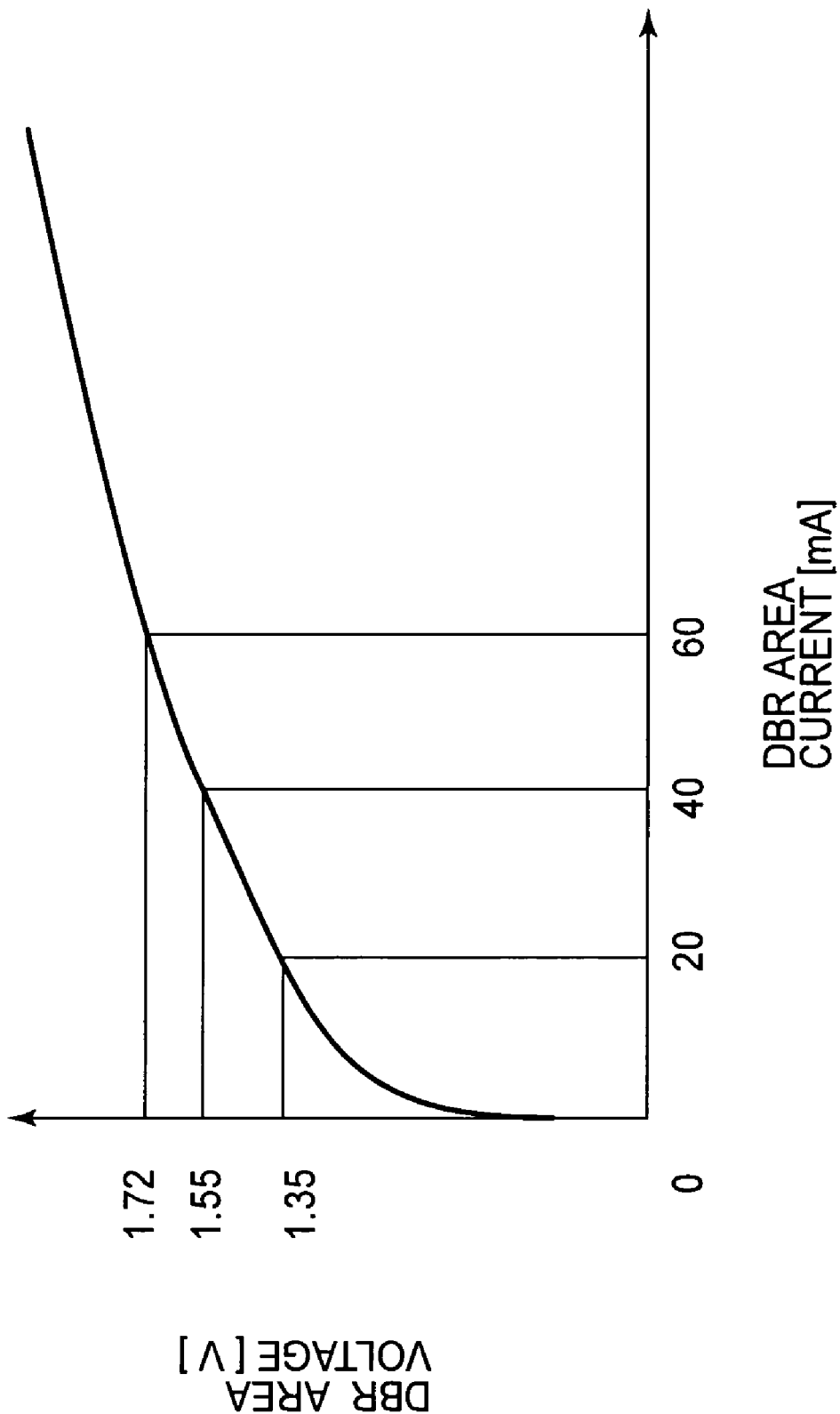
FIG. 5 is a graph showing a relationship between a current and a voltage in a DBR area in an Embodiment of the present invention.

FIG. 4 is a graph showing a wavelength dependency of a SHG light output. The phase adjustment wavelength of the SHG device 104 is adjusted to 1064.0 nm by adjusting a polarization inversion period of the above described polarization inversion area 105. Further, an ordinate of the graph shown in FIG. 4 is normalized by taking a maximum of the SHG light output as 1. FIG. 5 is a graph showing a relationship between a current and a voltage in the DBR area 101c when a constant current $I_G$ of 100 mA and a constant current Ip of 20 mA are injected into the active area 101a and the phase area 101b, respectively. In this embodiment, a drive current to be injected into the DBR area 101c is set so that a bias current $I_0$ as a center is 40 mA and a current $I_{hi}$ and a current $I_{lo}$ are 60 mA and 20 mA, respectively. From FIG. 5, the DBR area drive voltage include $V_{hi}$=1.72 V, $V_0$=1.55 V, and $V_{lo}$=1.35 V. Accordingly, when a pulse width ratio is set to $t_{hi}:t_{lo}$=1:1.18 so as to satisfy a relationship (2) shown below, heat generated in the DBR area 101c in the time period $t_{hi}$ can be compensated in the time period $t_{lo}$.

$$(I_{hi}) \times H_{hi} - I_0 \times V_0) \times t_{hi} = (I_0 \times V_0 - I_{lo} \times V_{lo}) \times t_1 \qquad (2)$$

Further, the current in the active area 101a is constant and the light energy inputted into the SHG device 104 is constant, so that there is no temperature fluctuation of the SHG device 104 itself and the phase adjustment wavelength of the SHG device 104 is kept at 1064.0 nm.

In this embodiment, the respective current values of the currents in the active area 101a and the phase area 101b and the drive current in the DBR area 101c are set in advance so as to provide $\lambda_{lo}$=1064.27 nm, $\lambda_0$=1064.12 nm, and $\lambda_{hi}$=1064.0 nm, and the output of the SHG light 108 is maximum when the current $I_{hi}$ is injected.

Figure 6A:
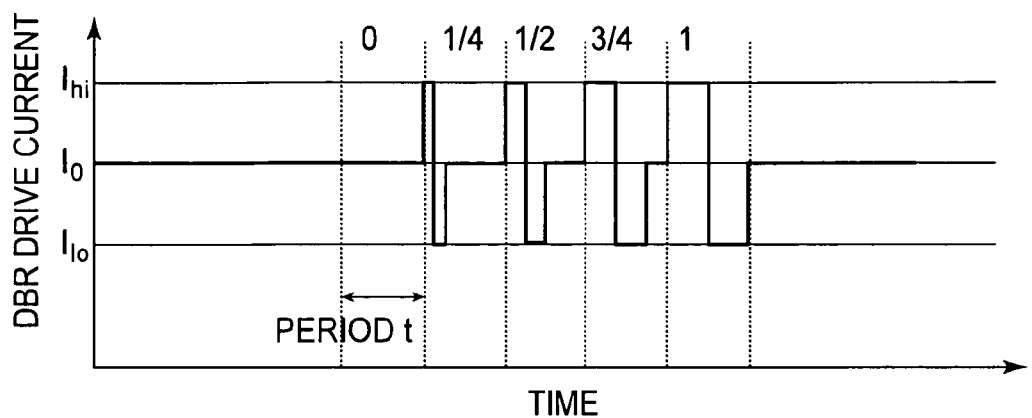
FIGS. 6A and 6B, FIGS. 7A and 7B, and FIGS. 8A, 8B and 8C are time charts of DBR drive current and SHG light output in Embodiment 1, Embodiment 2, and Embodiment 3, respectively, of the present invention.
Figure 6B:
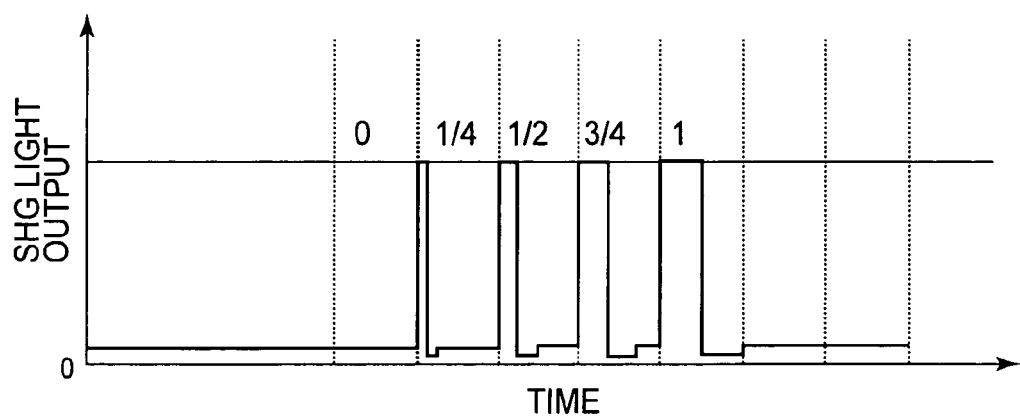

In the above-described optical waveform converter, in the case where a drive current including five modulation patterns of $(t_{hi}, t_{lo})$=(0ns, 0ns), (¼)×(23 ns, 27 ns), (½)×(23 ns, 27 ns), (¾)=(23 ns, 27 ns), and (23 ns, 27 ns) is inputted into the DBR area 101c with one period t of 50 ns as shown in FIG. 6A, an output wavelength as shown in FIG. 6B is obtained. In the five periods, SHG light powers are 0.03 mW, 0.63 mW, 1.21 mW, 1.80 mW, and 2.40 mW, respectively. As a result, it is possible to obtain such a light output that it is substantially proportional to the pulse widths of the above-described modulation patterns depending on modulation signal. Further, an extinction ratio is 1:80. According to this embodiment, it is found that it is possible to control the SHG light output by controlling the pulse width, i.e., it is possible to modulate the output of SHG light of small wavelength of 532 nm depending on the modulation signal.

As described above, the set first to third modulated currents are retained and the pulse widths of the first modulated current and the third modulated current are changed for each gradation level while keeping a ratio of the pulse widths, whereby it is possible to effect gradation display.

Embodiment 2

In Embodiment 1, the wavelength $\lambda_{hi}$, during the injection of the current $I_{hi}$ into the DBR area 101c of the semiconductor DBR laser 101 is adjusted to the phase adjustment wavelength of the SHG device 104. In this embodiment, the wavelength $\lambda_0$ during the injection of the current $I_0$ into the DBR area 101c is adjusted to the phase adjustment wavelength of the SHG device 104. In addition, in modulation of drive current in the DBR area in this embodiment, a time width (duration) for injecting the current $I_{hi}$ is extended and changed from a start point of each period t as one reference time and a time width for injecting the current $I_{lo}$ is extended and changed from a middle point of each period t as another reference time.

The constitution of the optical waveform converter in this embodiment is identical to that at the optical waveform converter shown in FIG. 1 in Embodiment 1 except that the temperature of the SHG device or the period (pitch) of the polarization inversion area 105 is adjusted so that the quasi-phase adjustment wavelength of the SHG device 104 is approximately 1064.12 nm, thus being omitted from explanation.

Figure 7A:
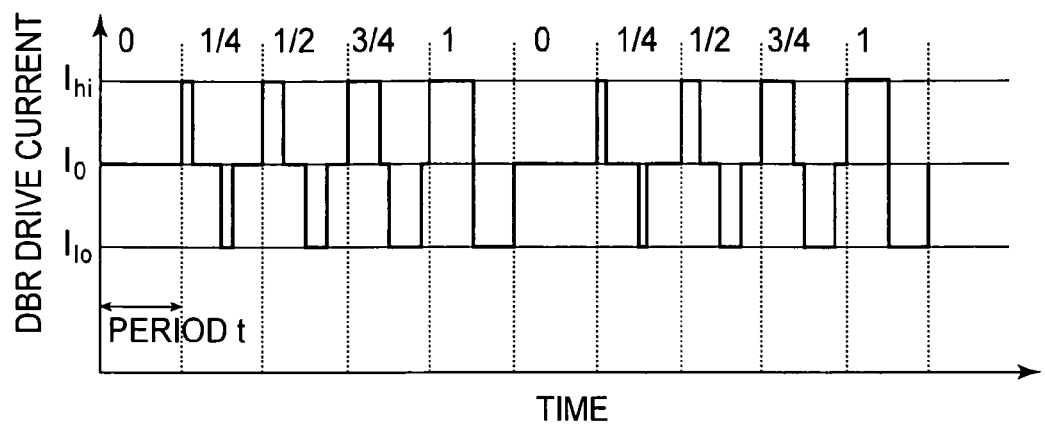
Figure 7B:
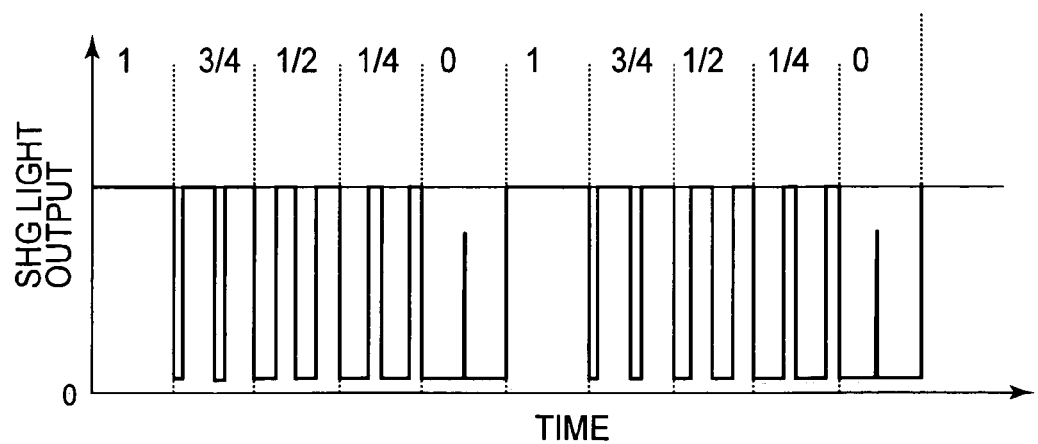

In the above described optical waveform converter, in the case where a drive current including five modulation patterns of $(t_{hi}, t_{lo})$=(Ons, Ons), (¼)×(23 ns, 27 ns), (½)×(23 ns, 27 ns), (¾)=(23 ns, 27 ns), and (23 ns, 27 ns) is inputted into the DBR area 101c with one period t of 50 ns as shown in FIG. 7A, an output wavelength as shown in FIG. 7B is obtained. In the five periods, SHG light powers are 4.52 mW, 3.73 mW, 2.49 mW, 1.30 mW, and 0.13 mW, respectively (in a ratio of approximately 1:3/4:1/2:1/4:0). As a result, it is possible to obtain such a substantially linear characteristic that larger pulse widths $t_{hi}$ and $t_{lo}$ provide smaller light output. Further, an extinction ratio is 1:35. In this embodiment, the dark level (low-output SHG light power level) is somewhat larger that that in Embodiment 1 but the bright level is effectively increased (since the SHG light power is instantaneously increased because of the switching of the wavelength from $\lambda_{hi}$ to $\lambda_{lo}$ through $\lambda_0$). As a result, also according to this embodiment, it is found that it is possible to control the SHG light output by controlling the pulse width similarly as in Embodiment 1.

Embodiment 3

In Embodiments 1 and 2, the constant current is injected into the active area 101a. In this embodiment, a modulated current is injected into the active area 101a. The injection current injected into the DBR area 101c in this embodiment is similar to that shown in FIG. 7A in Embodiment 2 and is shown also in FIG. 8A. The injection current injected into the active area 101a is shown in FIG. 8B. In this embodiment, the modulated current (injection current) including two values of $I_G$ and $I_{th}$ such that the pulse width does not depend on period is injected into the active area 101a. $I_{th}$ is set to a threshold current or a value of not more than the threshold current. Points of $I_{th}$ are set so that the modulated current to be injected into the DBR area 101c can be changed from $I_{hi}$ to $I_{lo}$ (or $I_{lo}$ to $I_{hi}$) Examples of these points include those of the reference times in each period described in Embodiment 2. The pulse width for $I_{th}$ may desirably be a width (duration) capable of removing the portion where the SHG light power is instantaneously increased in Embodiment 2. In this embodiment, the pulse width is ½0 of one period. The pulse width is independent of the period, so that an amount of heat injected into the active area is constant. As described above, in this embodiment, the same current including the two values is injected into the active area for each period.

Figure 8A:
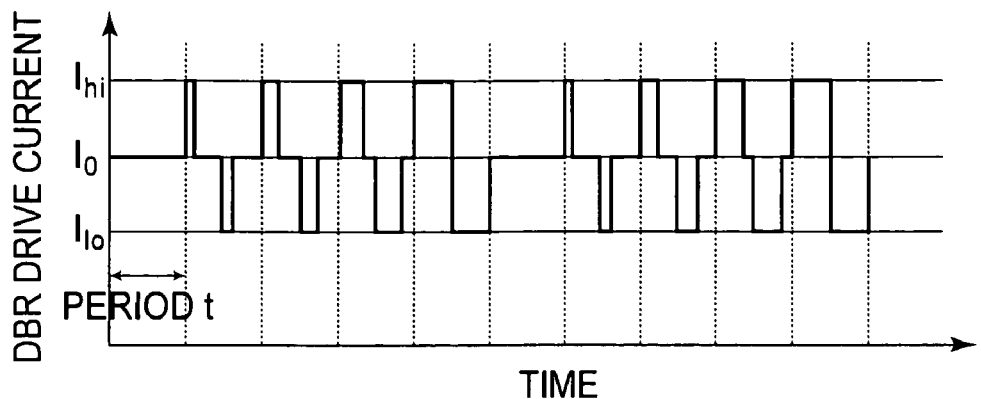
Figure 8B:
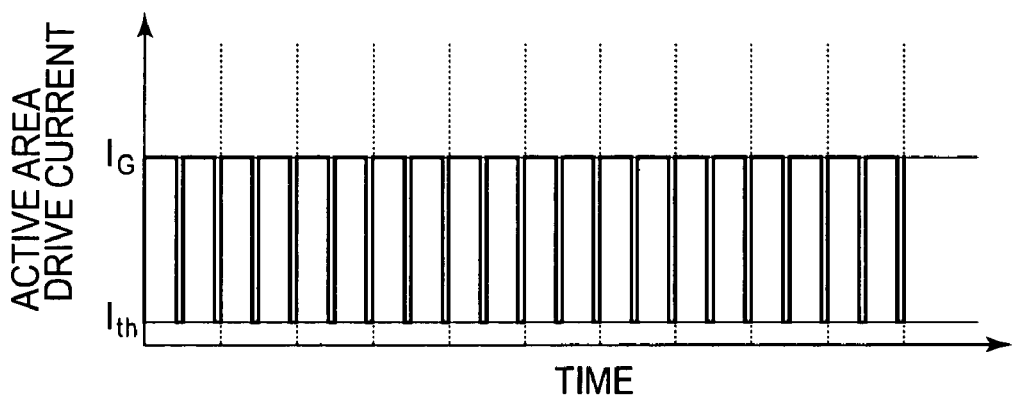
Figure 8C:
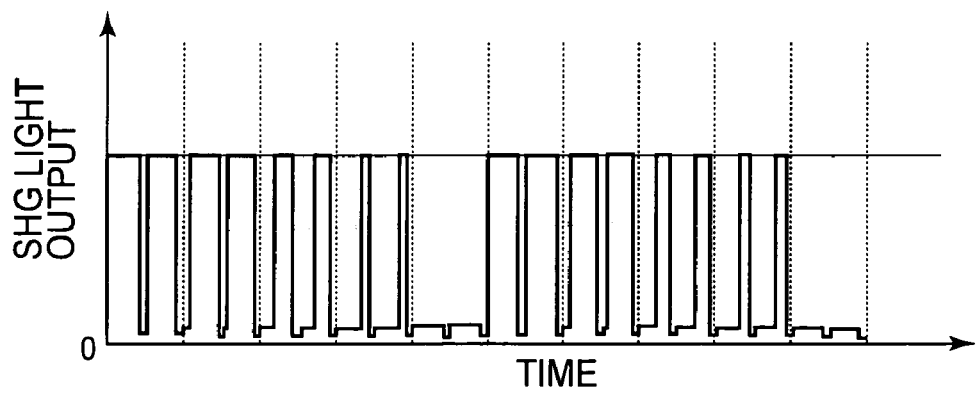

In the optical waveform converter described above, in the case where the currents shown in FIGS. 8A and 8B are injected, an output wavelength of the SHG light as shown in FIG. 8C is obtained. Compared with that in Embodiment 2, a maximum SHG light power is somewhat decreased. However, the current injected into the active area is the same as the threshold current and an intensity of the laser light is very small, so that it is possible to suppress an instantaneous occurrence of the SHG light caused during the switching from $\lambda_{hi}$ to $\lambda_{lo}$. As a result, compared with Embodiment 2, it is possible to improve the extinction ratio.

Embodiment 4

Figure 9:
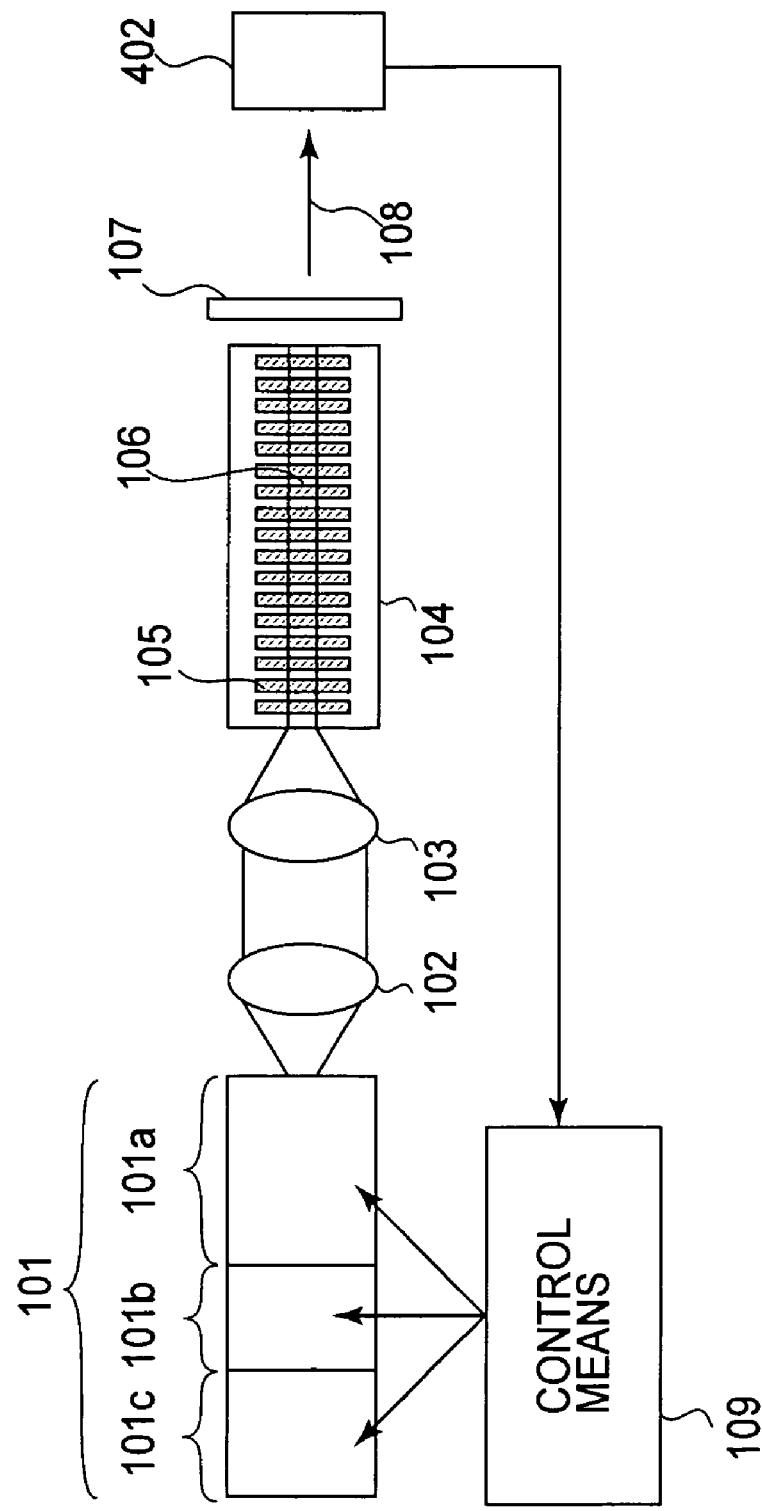
FIG. 9 is a schematic view for illustrating a constitution of an optical waveform converter in FIG. 4 of the present invention.
Figure 10:
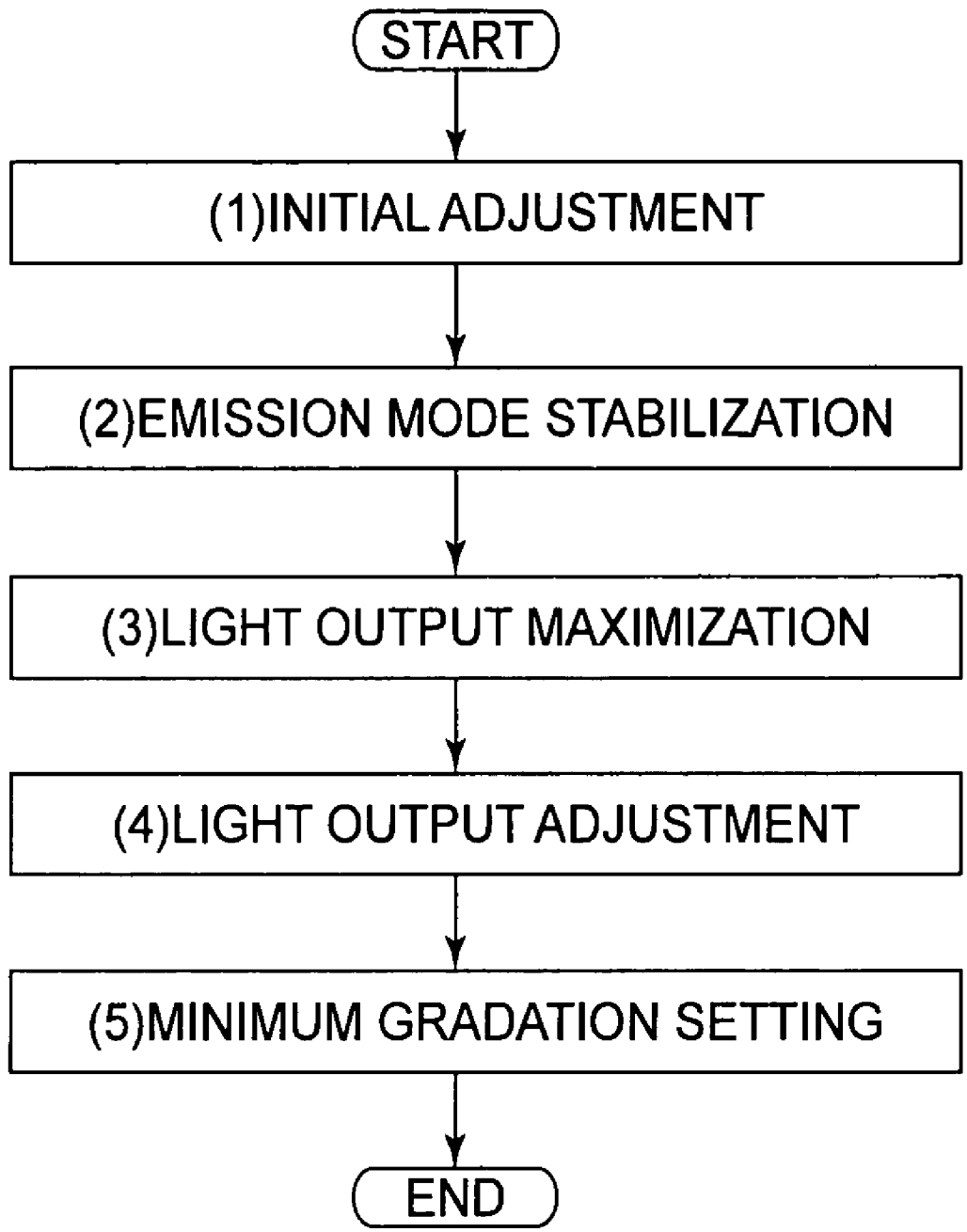
FIG. 10 is a flow chart of a control method in Embodiment 4 of the present invention.

In this embodiment, a control method of the optical waveform converter according to the present invention will be described with reference to FIGS. 9 to 15. The optical waveform converter has a constitution, as shown in FIG. 9, which is identical to that shown in FIG. 1A except that an optical detector 502 is added. FIG. 10 is a flow chart of the control method and FIGS. 11 to 15 are flow charts of respective steps of the control method.

(1) First Step

Figure 11:
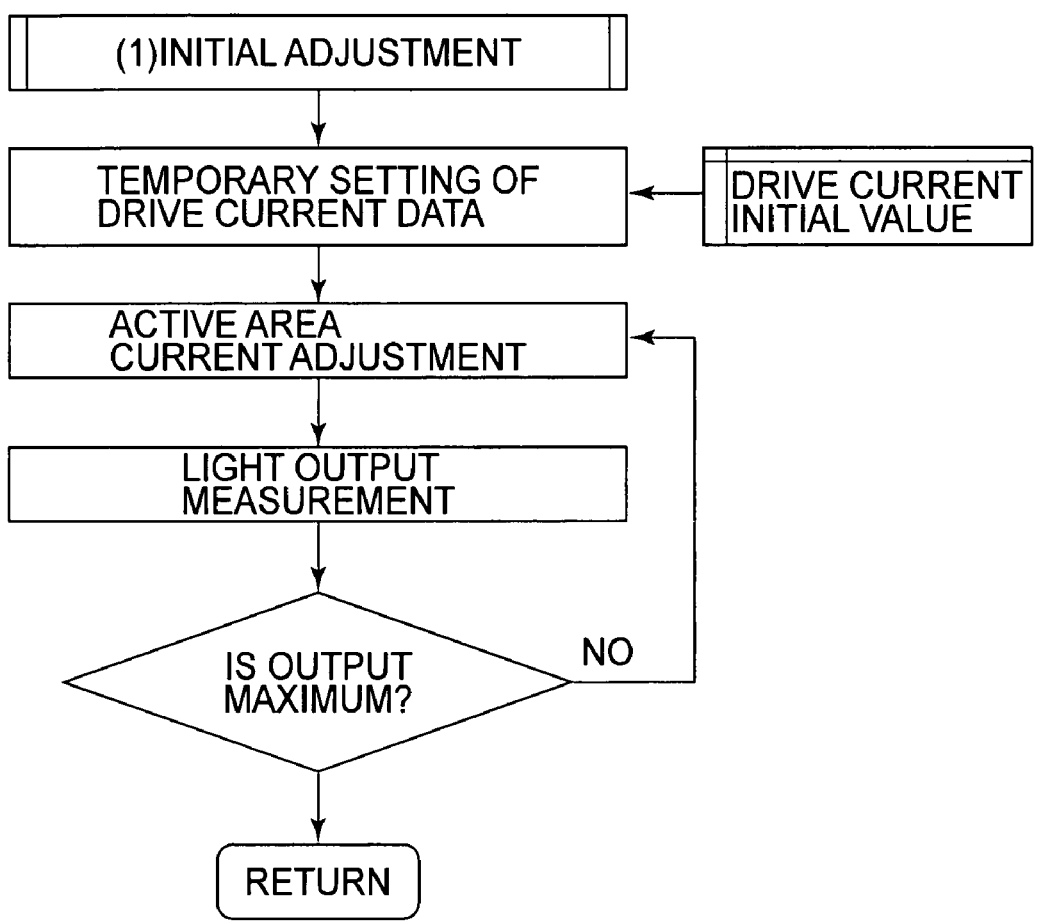
FIGS. 11 to 15 are flow charts for explaining a first step to a fifth step, respectively, of the control method in Embodiment 4 of the present invention.

Initial adjustment is effected in accordance with a procedure shown in FIG. 11.

More specifically, one period is set to 50 ns and a modulated current including $I_{hi}$=200 mA and $I_{lo}$=5 mA is injected into the DBR area 101c at pulse widths of 10 ns and 40 ns, respectively. Further, a constant current Ip of 30 mA is injected into the phase area 101b. These values are initial set values (drive current initial values) which have been preliminarily set. Next, a constant current $I_G$ injected into the active area 101a is increased and adjusted so that an intensity of SHG light is a maximum. At this time, a wavelength and power of light from the DBR laser are changed. A time period in which the current $I_{lo}$ is injected is longer, so that the SHG light intensity is the maximum when an emission wavelength determined by $I_{lo}$ is closest to the phase adjustment wavelength of the SHG device.

(2) Second Step

Figure 12:
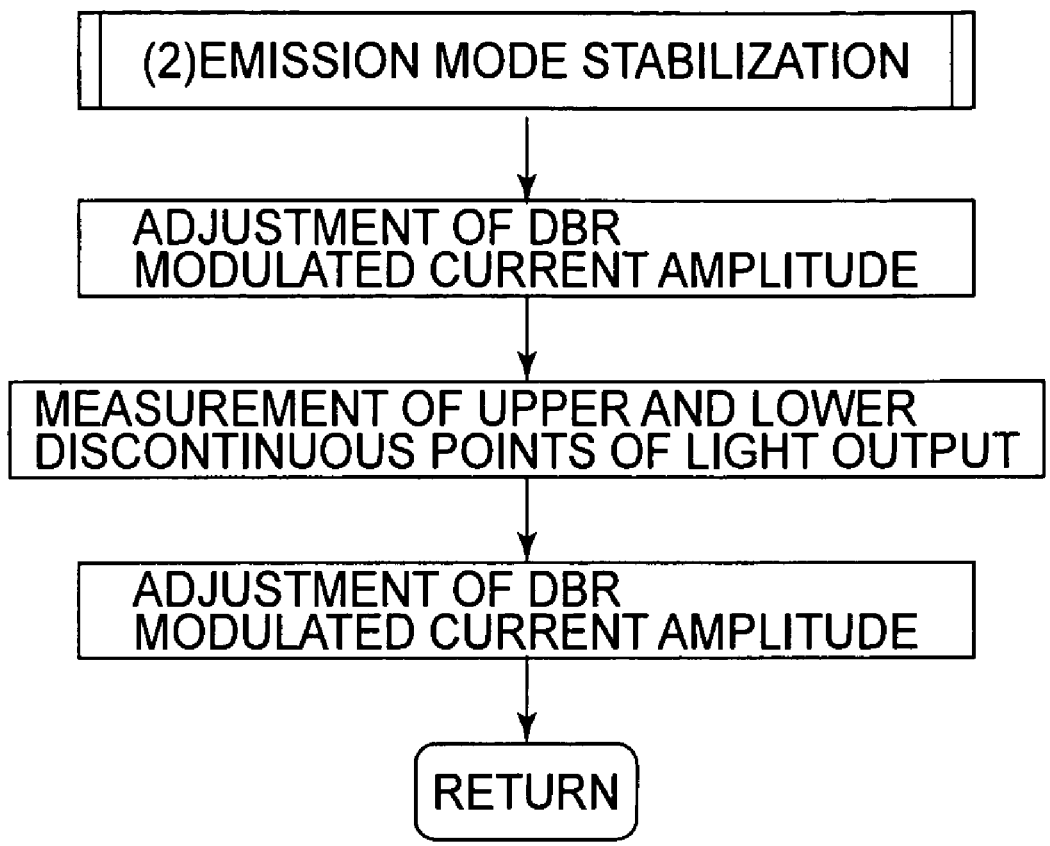

Stabilization of a light emission mode is effected (FIG. 12).

The current value $I_{hi}$ is caused to fluctuated with a center value of 200 mA while fixing the current value $I_{lo}$ which is the lower-level current value in the DBR area 101c, and a point at which the output of the SHG light is largely lowered (mode hop point) is detected on both sides of the center value (200 mA). The current value $I_{hi}$ is set to an average of the mode hop points.

(3) Third Step

Figure 13:
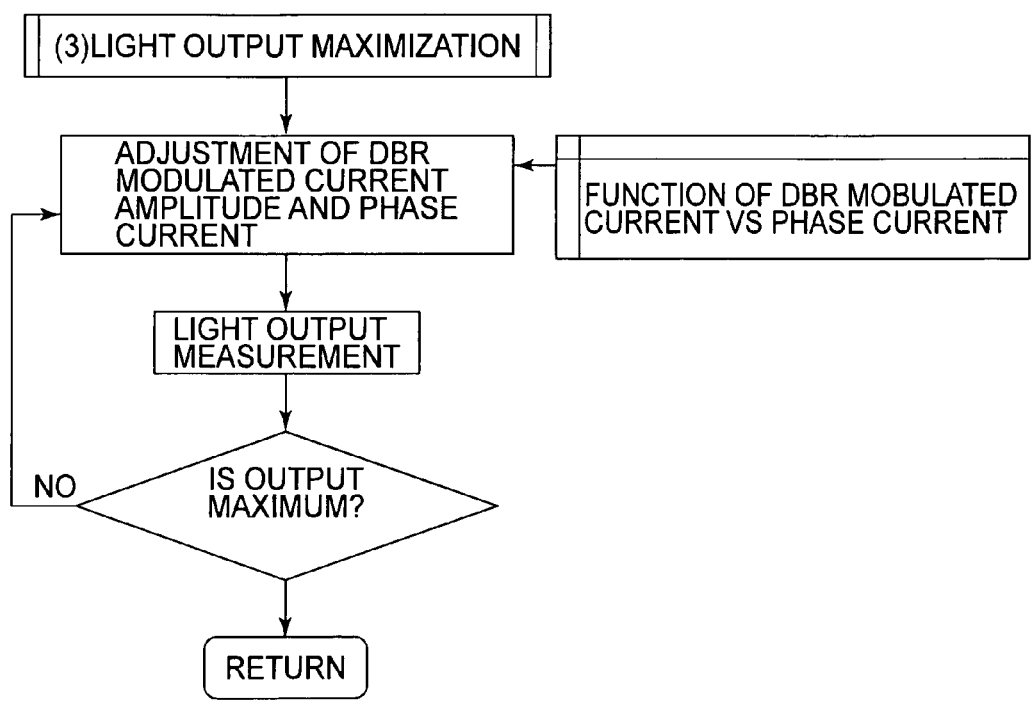

Maximization of the light output is effected (FIG. 13).

In this step, the light output is maximized by adjusting the current value $I_{hi}$ which is the higher-level current value in the DBR area and the current Ip in the phase area under such a condition that the mode hop is not caused to occur.

The condition for eliminating the mode hop will be described below.

A change $\Delta \lambda_{BRAGG}$ of a Bragg wavelength $\lambda_{BRAGG}$ when a refractive index of the DBR area is changed by $\Delta n_D$ is represented by the following formula (3):

$$\Delta \lambda_{BRAGG}/\lambda_{BRAGG} = \Delta n_D/n \quad (3),$$

wherein n represents a refractive index of the respective areas of the DBR laser on the precondition that refractive indices of the respective areas of the DBR laser are substantially equal to each other.

A change $\Delta \lambda_{CAVITY}$ of a vacity (resonator) wavelength $\lambda_{CAVITY}$ when a refractive index of the DBR area is changed by $\Delta n_D$ and a refractive index of the phase area is changed by $\Delta n_D$ is represented by the following formula (4):

$$\Delta \lambda_{CAVITY}/\lambda_{CAVITY} = (\Delta n_D + L_{Deff} + \Delta n L_p + L_p)/(L_{Deff} + L_p + L_G), \quad (4)$$

wherein $L_G$ represents a length of the phase area, $L_P$ represents a length of the phase area, and $L_{Deff}$ represents an effective length of the DBR area.

The condition for eliminating the mode hop is such a condition that degrees of wavelength changes in formulas (3) and (4) are equal to each other. Accordingly, on condition that the right side of the formula (3) is equal to the right side of the formula (4), the following relationship (5) is obtained.

$$(L_G + L_P)\Delta n_D = L_P \times \Delta n L_P \quad (5).$$

Amounts of changes in refractive index of the respective areas are proportional to an amount of change in power per unit length supplied to an associated area. When the amounts of change in power supplied to the DBR area and the phase area are taken as $\Delta P_{DBR}$ and $\Delta P_{Phase}$, the relationship (5) can be rewritten as the following relationship (6):

$$(L_G + L_P)\Delta P_{DBR}/L_D = \Delta P_{Phase} \quad (6),$$

wherein $L_D$ represents a length of the DBR area.

Accordingly, by adjusting the upper-level current value $I_{hi}$ in the DBR area and the current $I_P$ in the phase area so as to satisfy the relationship (6) (function of DBR modulated current vs. phase current), it is possible to continuously change the emission wavelength without causing the mode hop. The amounts of power supplied to the respective areas can be calculated by preliminarily knowing an associated current-voltage relationship. In other words, the condition for eliminating the mode hop is preliminarily obtained. In this step, the output of the SHG light is adjusted to a maximum while keeping the relationship (6), thus setting the upper-level current value $I_{hi}$ in the DBR area and the current $I_P$ in the phase area.

(4) Fourth Step

Figure 14:
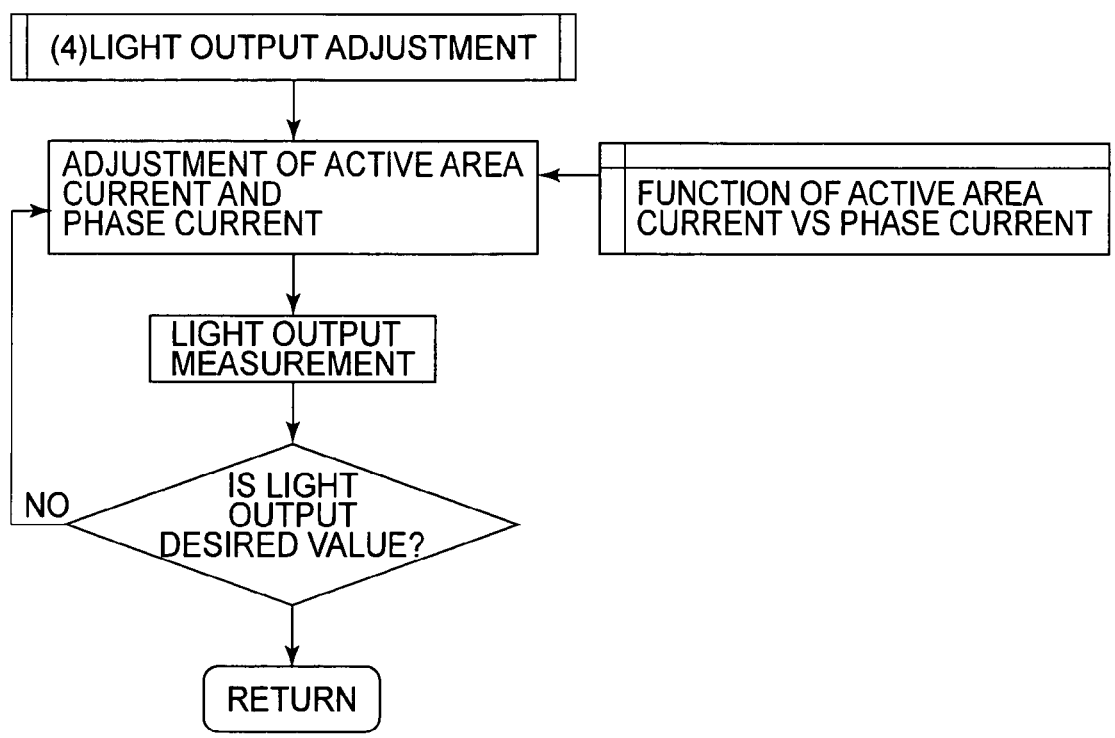

Adjustment of light output is effected (FIG. 14).

In order to adjust the light output to a desired level, the current in the active area and the current in the phase area are determined in this step.

The cavity wavelength may be kept constant in order to change only the SHG light output without changing the emission wavelength. In other words, satisfaction of the following relationship (7) may only be required.

$$\Delta n_G \times L_G + \Delta n_P \times L_P = 0 \quad (7).$$

In the relationship (7), $\Delta n_G$ represents an amount of change in refractive index of the active area.

As described above, amounts of changes in refractive index of the respective areas are proportional to an amount of change in power per unit length supplied to an associated area. When the amount of change in power supplied to the active area is taken as $\Delta P_{Gain}$, the relationship (7) can be rewritten as the following relationship (8):

$$\Delta P_{Gain} + \Delta P_{Phase} = 0 \quad (6),$$

Accordingly, by adjusting the current $I_G$ in the active area and the current $I_P$ in the phase area so as to satisfy the relationship (8) (function of active area current vs. phase current), it is possible to continuously change the emission wavelength while keeping the emission wavelength. The amounts of power supplied to the respective areas can be calculated by preliminarily knowing an associated current-voltage relationship. In other words, the relationship in which the cavity wavelength is not changed is preliminarily obtained. In this step, the output of the SHG light is adjusted to a desired value while keeping the relationship (8), thus setting the current $I_G$ in the active area and the current $I_P$ in the phase area. The desired value of the SHG light output is, e.g., required in view of a relationship with a light output intensity of another color such as red or blue in the case of effecting full-color image display.

(5) Fifth Step

Figure 15:
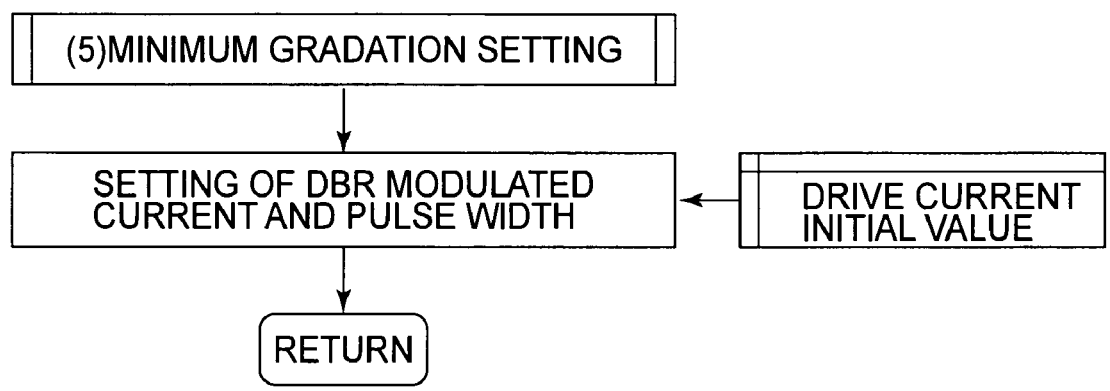

Setting of a minimum gradation is effected (FIG. 15).

A pulse width of the upper-level current value $I_{hi}$ of the modulated current in the DBR area is determined so as to keep a relationship in which an amount of heat injected into the DBR area is constant in the case where a pulse width of the lower-level current value $I_{lo}$ of the modulated current in the DBR area is set to zero. As a medium-level current value $I_0$ of the modulated current in the DBR area, a preliminarily set value is used. In this case, the relationship between the current values $I_{hi}$ and $I_0$ may be reversed. More specifically, after the pulse width of the current value $I_{hi}$ is preliminarily set to a value, the current value $I_0$ may be determined so as to keep the relationship in which the amount of heat injected into the DBR area is constant.

As described above, in the fifth step, the pulse width of one of first and second modulated currents is set to a preliminarily set minimum value including zero and a pulse width of the other modulated current and a value of the second modulated current are adjusted so that the output of the second harmonic (wave) is a minimum while keeping the relationship in which the amount of heat injected into the DBR area is constant. For this purpose, the fifth step includes a step of setting the pulse width of the other modulated current and the value of the second modulated current. The relationship in which the amount of heat injected into the DBR area is preliminarily obtained.

In this step, the respective current values are $I_G$=512 mA, $I_P$=35.2 mA, $I_{lo}$=5 mA, $I_0$=70 mA, and $I_{hi}$=211.0 mA, and the respective pulse widths are 10 ns (upper side) and 40 ns (lower side) in the DBR area during maximum gradation and 0.3 ns (upper side) and 0 ns (lower side) during minimum gradation. In the case of displaying intermediary (medium) gradation, it is possible to realize the pulse widths by linearly interpolating the pulse widths during minimum gradation.

In this embodiment, the optical detector 402 for monitoring the amount of the SHG light is used. In addition thereto, another optical detector for monitoring an amount of fundamental wave light of the DBR laser may also be provided. In this case, it is possible to know a conversion efficiency into the SHG light, so that it is possible to effect more accurate adjustment by maximizing the conversion efficiency in this step.

Further, it is also possible to effect setting so that the intensity of the SHG light is high when the upper-level current value $I_{hi}$ is injected into the DBR area. In this case, the control may be effected by changing the upper-level current value and the lower-level current value to each other in this step.

Embodiment 5

In the fifth step of Embodiment 4, the intermediary current value $I_0$ of the modulated current in the DBR area is preliminarily set. In this embodiment, as the fifth step, the following step as shown in FIG. 16 is used.

(5-2) Fifth Step

Figure 16:
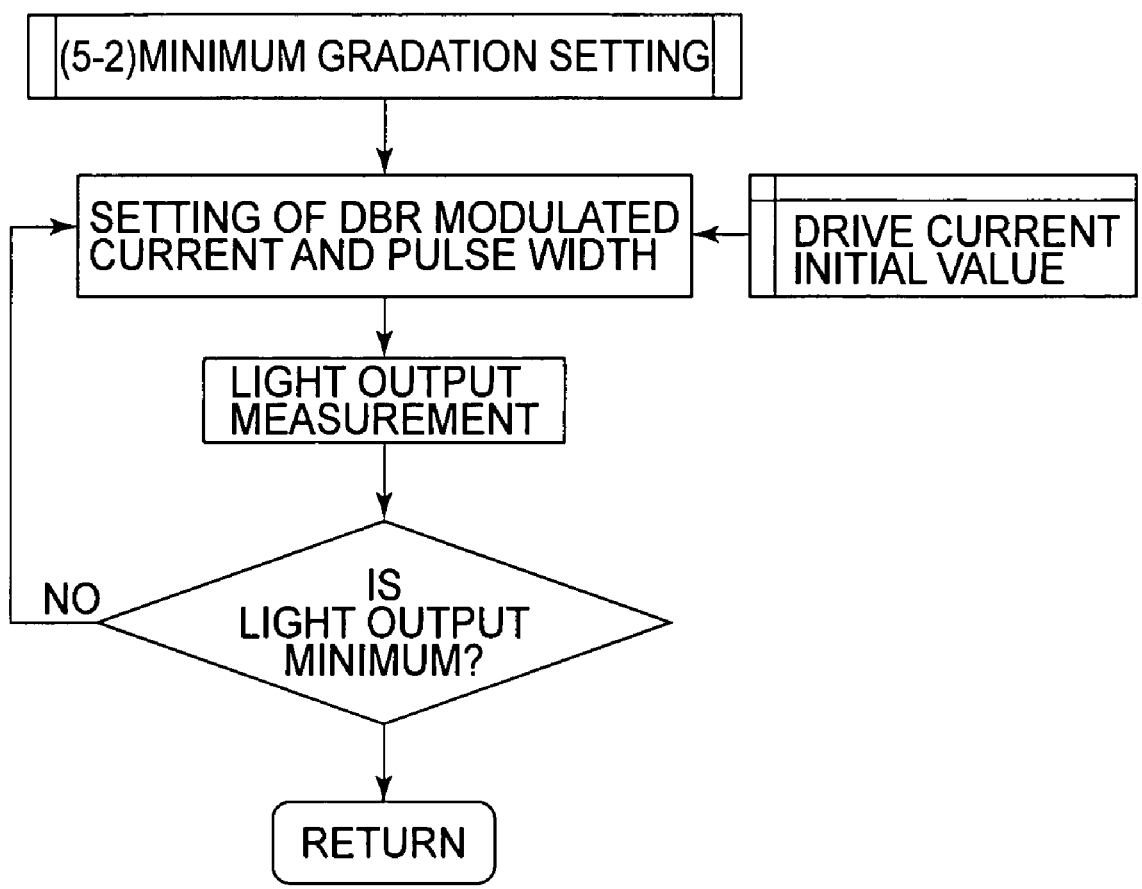
FIG. 16 is a flow chart for explaining a fifth step of a control method in Embodiment 5 of the present invention.

Setting of a minimum gradation is effected (FIG. 16).

A pulse width of the upper-level current value $I_{hi}$ of the modulated current in the DBR area is determined so as to keep a relationship in which an amount of heat injected into the DBR area is constant in the case where a pulse width of the lower-level current value $I_{lo}$ of the modulated current in the DBR area is set to zero. As a medium-level current value $I_0$ of the modulated current in the DBR area, a preliminarily set value is used.

Further, the pulse widths of the upper-level current value $I_{hi}$ and the intermediary-level current value $I_0$ of the modulated current in the DBR area are adjusted while keeping the relationship in which the amount of heat injected into the DBR area is constant, thus effecting setting so that the intensity of the SHG light is a minimum. In this embodiment, the SHG light intensity during minimum gradation can be decreased, so that it is possible to improve the extinction ratio.

The setting method of minimum gradation in this step is not limited to that described above but may also be realized by adjusting the pulse widths and the current values so as to keep the relationship in which the amount of heat injected into the DBR area is constant.

Embodiment 6

Figure 17:
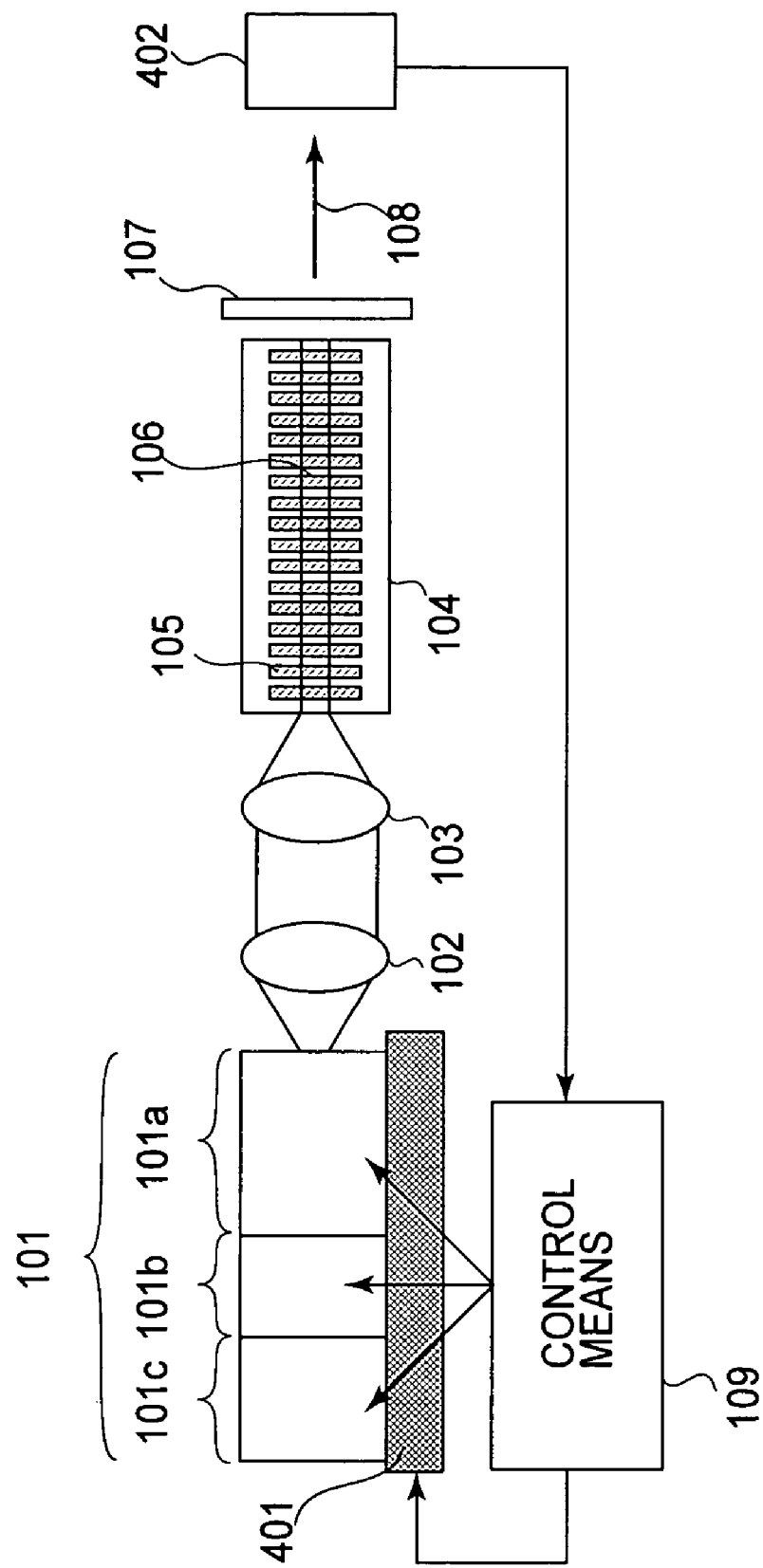
FIG. 17 is a schematic view for illustrating a constitution of an optical waveform converter in Embodiment 6 of the present invention.

FIG. 17 is a constitutional view of the optical waveform converter according to Embodiment 6 of the present invention. A basic constitution of the optical waveform converter in this embodiment is identical to that shown in FIG. 9 except that Peltier element 401 on which the DBR laser 101 is mounted is added, thus being omitted from explanation. A flow chart of a control method in this embodiment is identical to that shown in FIG. 10 except that the first step is changed to the following step.

(1-2) First Step

Figure 18:
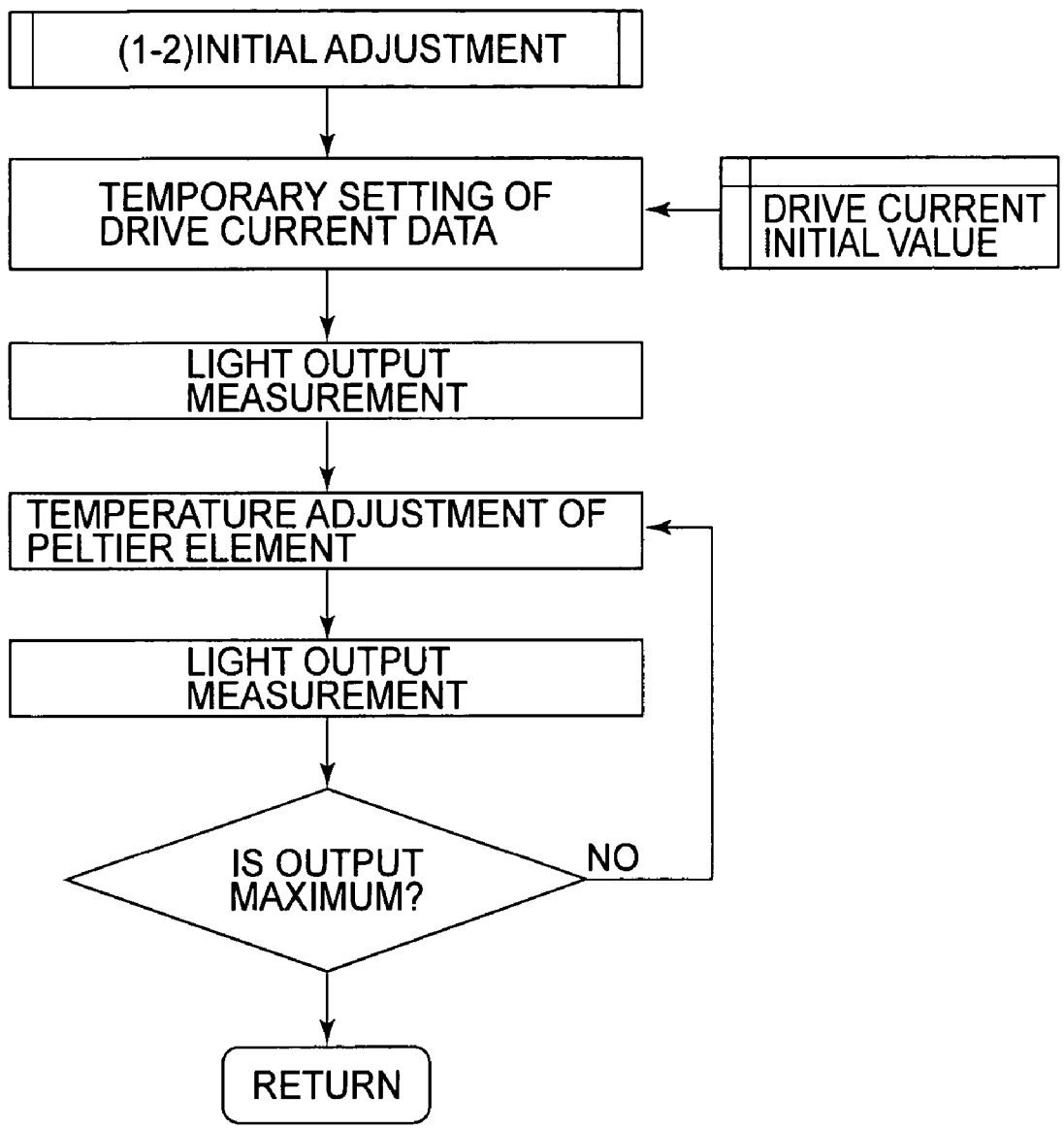
FIG. 18 is a flow chart for explaining a first step of a control method in Embodiment 6 of the present invention.

Initial adjustment is effected in accordance with a procedure shown in FIG. 18.

More specifically, one period is set to 50 ns and a modulated current including $I_{hi}$=200 mA and $I_{lo}$=5 mA is injected into the DBR area 101c at pulse widths of 10 ns and 40 ns, respectively. Further, a constant current Ip of 30 mA is injected into the phase area 101b. Into the active area 101a, a constant current $I_G$ of 400 mA is injected. These values are initial set values (drive current initial values) which have been preliminarily set. Next, a temperature of the Peltier element 401 is controlled and adjusted so that an intensity of SHG light is a maximum.

In this embodiment, deviation of wavelength can be corrected by adjusting the temperature of the DBR laser even in the case where there is a difference between the phase adjustment wavelength of the SHG device and the emission wavelength of the DBR laser. As a result, it is not necessary to effect high-accuracy screening of the respective devices, so that a yield is improved.

Further, in this embodiment, the Peltier element 401 is used so as to adjust the temperature of the entire DBR laser 101 but the present invention is not limited thereto. For example, it is also possible to use an integrated thin film heater formed on the DBR laser so as to permit selective heating of the DBR area of the DBR laser or a temperature control circuit, such as the Peltier element, on which the SHG device 104 is mounted.

Embodiment 7

In this embodiment, a control method of the optical waveform converter according to the present invention will be described with reference to the drawings. The constitution of the optical waveform converter is similar to that shown in FIG. 9, and the basic flow of the control method is similar to that shown in FIG. 10. In this embodiment, setting is effected so that the SHG light intensity is increased when the intermediary-level current value $I_0$ is injected into the DBR area.

(1-3) First Step: Initial Adjustment

In this step, one period is set to 50 ns and a constant current value $I_0$ of 70 mA is injected into the DBR area 101c. Further, a constant current Ip of 30 mA is injected into the phase area 101b. These values are initial set values which have been preliminarily set. In this step, into the DBR area 101c, it is also possible to inject such a modulated current that it is combination of $I_0$=70 mA for most of one period and $I_{hi}$=200 mA for a slight time of one period. As a result, such an effect that the light emission state is stabilized is achieved.

As described above, the first step includes a step of injecting a modulated current, consisting of a preliminarily set first modulated current having a pulse period including zero and a preliminarily set second modulated current, into the DBR area so as to provide a maximum gradation level. Further, the first step also includes a step of adjusting an injection current to be injected into the active area or a temperature of the DBR laser or the optical waveform conversion device so as to provide a substantially maximum output or conversion efficiency of the second harmonic (wave) light during the injection step.

(2-3) Second Step: Stabilization of Emission Mode

Stabilization of a light emission mode is effected (FIG. 12).

The current value $I_{hi}$ is caused to fluctuated with a center value of 70 mA, and a point at which the output of the SHG light is largely lowered (mode hop point) is detected on both sides of the center value (70 mA). The current value $I_0$ is set to an average of the mode hop points. As described above, the second step includes a step of detecting a current value at which the output of the second harmonic light or the fundamental wave light is largely changed in the case where the second modulated current is increased or decreased from the preliminarily set value, thereby to set the second modulated current to the current value providing a smaller change in output.

(3-3) Third Step: Maximization of Light Output

In this step, the light output is maximized by adjusting the current value $I_0$ which is the intermediary-level current value in the DBR area and the current Ip in the phase area under such a condition that the mode hop is not caused to occur (the relationship (6) described above). Thus, the third step includes a step of setting the injection current injected into the phase area and the second modulated current so as to provide a maximum output or conversion efficiency of the second harmonic light by adjusting the injection current injected into the phase area and the second modulated current while keeping the relationship for eliminating the mode hop.

(4-3) Fourth Step: Light Output Adjustment

In this step, the output of the SHG light is adjusted to a desired value while keeping the relationship (8), thus setting the current $I_G$ in the active area and the current $I_P$ in the phase area. Thus, the fourth step includes a step of setting the injection current injected into the active area and the phase area so as to provide a desired value of output or conversion efficiency of the second harmonic light by adjusting the injection currents injected into the active area and the phase area while keeping the relationship in which the cavity wavelength of the DBR laser is not changed.

(5-3) Fifth Step: Setting of Minimum Gradation

Pulse widths of the lower-level current value $I_{lo}$ and the upper-level current value $I_{hi}$ are determined so as to keep a relationship in which an amount of heat injected into the DBR area is constant in the case where the modulated current injected into the DBR area is a two-valued modulated current including the lower-level current value $I_{lo}$ and the upper-level current value $I_{hi}$. As the lower-level current value $I_{lo}$ and the higher-level current value $I_{hi}$ of the modulated current in the DBR area, preliminarily set values are used. In this case, the relationship between the pulse widths and values of the currents may be reversed.

As described above, the fifth step includes a step of setting the pulse width of the second modulated current to zero and setting the pulse width and the value of the modulated current and those of the third modulated current while keeping the relationship in which the amount of heat injected into the DBR area is constant.

In this step, the respective current values are $I_G$=478 mA, $I_P$=32.2 mA, $I_{lo}$=5 mA, $I_0$=67.2 mA, and $I_{hi}$=200 mA, and the respective pulse widths are 0 ns (upper side and lower side) in the DBR area during maximum gradation and 11 ns (upper side) and 39 ns (lower side) during minimum gradation. In the case of displaying intermediary (medium) gradation, it is possible to realize the pulse widths by linearly interpolating the pulse widths during minimum gradation.

Embodiment 8

In the fifth step of Embodiment 7, the lower-level current value $I_{lo}$ and the upper-level current value $I_{hi}$ of the modulated current in the DBR area are preliminarily set. In this embodiment, as the fifth step, the following step including a step of lowering the output during minimum gradation is used.

(5-4) Fifth Step: Setting of Minimum Gradation

Pulse widths of the lower-level current value $I_{lo}$ and the upper-level current value $I_{hi}$ are determined so as to keep a relationship in which an amount of heat injected into the DBR area is constant in the case where the modulated current injected into the DBR area is a two-valued modulated current including the lower-level current value $I_{lo}$ and the upper-level current value $I_{hi}$. As the lower-level current value $I_{lo}$ and the higher-level current value $I_{hi}$ of the modulated current in the DBR area, preliminarily set values are used. In this case, the relationship between the pulse widths and values of the currents may be reversed.

Further, at fixed pulse widths of the lower-level current value $I_{lo}$ and the higher-level current value $I_{hi}$ of the modulated current in the DBR area, their current values $I_{lo}$ and $I_{hi}$ are adjusted while keeping the relationship in which the amount of heat injected into the DBR area is constant, thus effecting setting so that the intensity of the SHG light is a minimum.

As described above, in the fifth step of this embodiment, the pulse width of the second modulated current is set to zero and the value of the first modulated current and the third modulated current are adjusted while keeping the relationship in which the amount of heat injected into the DBR area is constant and keeping the predetermined pulse widths. For this purpose, the fifth step includes a step of setting the values of the first modulated current and the third modulated current so as to provide a minimum output of the second harmonic wave.

In this embodiment, the SHG light intensity during minimum gradation can be decreased, so that it is possible to improve the extinction ratio.

The setting method of minimum gradation in this step is not limited to that described above but may also be realized by adjusting the pulse widths and the current values so as to keep the relationship in which the amount of heat injected into the DBR area is constant.

Embodiment 9

In this embodiment, to the control methods described in Embodiments 4 to 8, a step of effecting control by monitoring an amount of light every certain period of time is added, whereby the amount of light can be stabilized.

More specifically, the amount of light during maximum gradation is monitored. In the case where the monitored value largely fluctuates compared with a predetermined value, e.g., by not less than 5%, the fourth and fifth steps are performed again to adjust the amount of light so that it is the predetermined value. In the case where the amount of light cannot be adjusted to the predetermined value by the above operation, the third to fifth steps are performed again. In the case where the amount of light cannot be still adjustable by the operation, the second to fifth steps and the first to fifth steps are performed again in this order of priority to effect adjustment of the amount of light.

According to this embodiment, it is possible to adjust the amount of light to a desired value even when the amount of SHG light fluctuates due to a change in environmental temperature.

Embodiment 10

Figure 19:
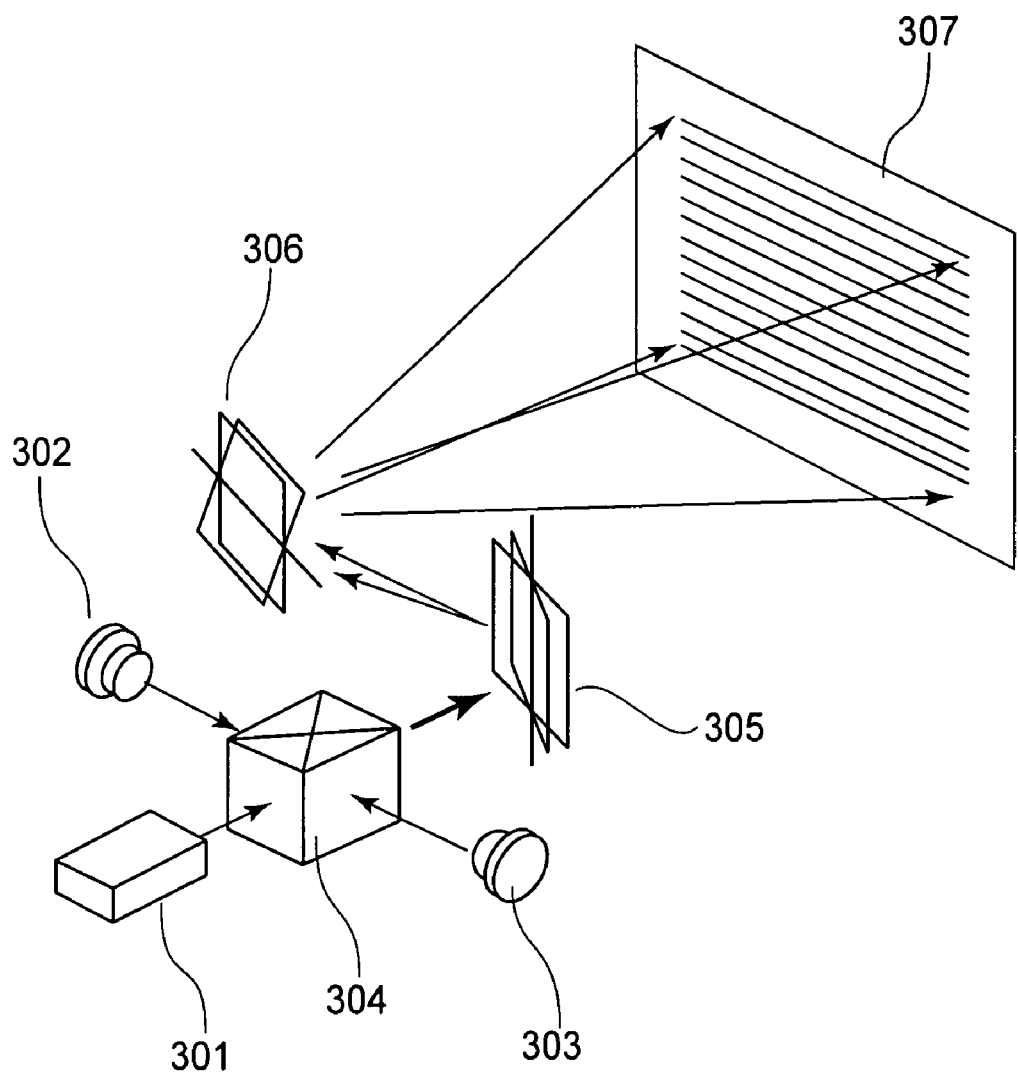
FIG. 19 is a schematic view showing an image forming apparatus in Embodiment 10 of the present invention.
Figure 20:
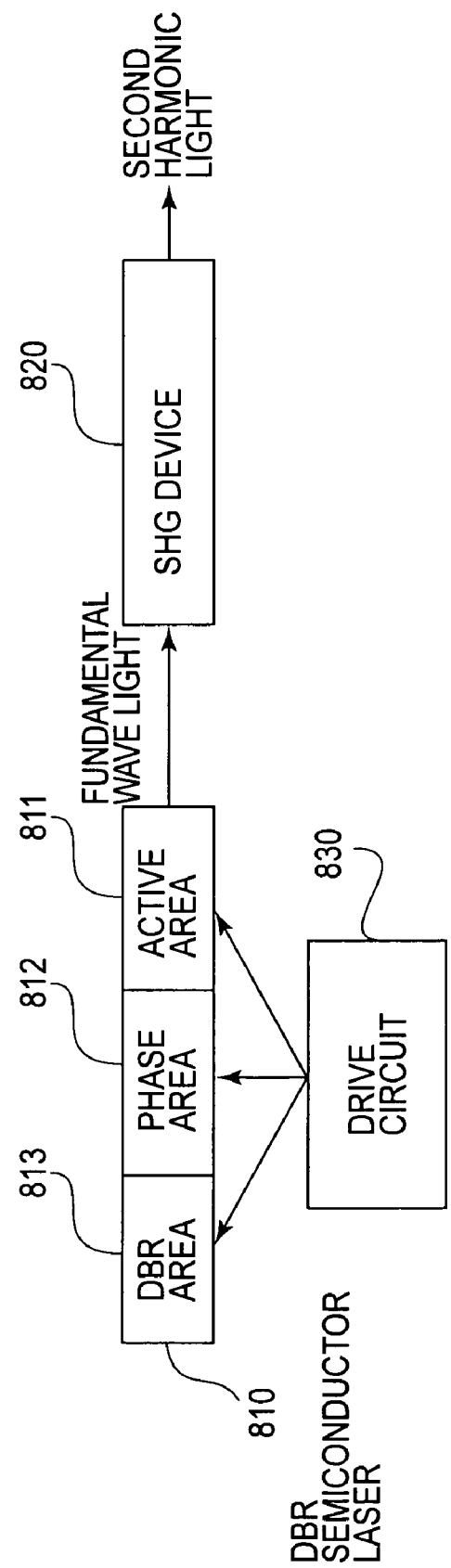
FIG. 20 is a schematic view showing a conventional constitution.

FIG. 19 shows a schematic constitutional view of an image forming (display) apparatus, using the optical waveform converter, according to Embodiment 10 of the present invention.

In the image forming apparatus of this embodiment, laser lights emitted from an optical waveform converter 301 for emitting green modulation light as described in Embodiment 2, a modulation light source 302 for emitting red laser light, and a modulation light source 303 for emitting blue laser light are multiplexed by a dichroic mirror 304. The multiplexed laser light is subjected to scanning with a horizontal scanning device 305 and a vertical scanning device 306 to form scanning lines on a screen 307. Based on gradation information regarding respective colors of red, green and blue generated by full-color image information, a two-dimensional full-color image is displayed on the screen 307 by effecting modulation of outputs of the respective light sources 301, 302 and 303. In this embodiment, a modulated current may only be required to be controlled for each period of pixel depending on a modulation signal corresponding to an image pixel on the screen 307.

Further, in the case of effecting the control methods described in Embodiment 4 to Embodiment 9, light output fluctuation due to the change in environmental temperature can be decreased in the optical image forming apparatus of this embodiment. More specifically, an initial output of light is determined by effecting control described in Embodiments 4 to 9 during power-on. In other words, when the image forming apparatus is started up, the above described first to fifth steps are performed. Further, in such a time period that an image is not formed, by effecting the control described in Embodiment 9, it is possible to keep the light output at a constant level.

The optical waveform converter according to the present invention has the same modulation performance as red semiconductor laser or the like, so that the above described image display apparatus is capable of displaying an image permitting high-definition gradation display. The optical waveform converter or optical wavelength conversion method of the present invention can also be applied to an image forming apparatus such as a laser beam printer or a copying machine, in addition to the above described laser display.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 190816/2005 filed Jun. 30, 2005 and 061926/2006 filed Mar. 7, 2006, which is hereby incorporated by reference.

What is claimed is:

1. An optical wavelength converter, comprising:
a distributed Bragg reflector laser having an active area, a phase area, and a distributed Bragg reflector area in which a distributed Bragg reflector is formed;
an optical wavelength conversion device for receiving fundamental wave light emitted from said distributed Bragg reflector laser and outputting second harmonic wave light of the fundamental wave light; and
a control circuit for controlling an emission wavelength and a light output by controlling an injection current to be injected into said distributed Bragg reflector laser for each period;
wherein said control circuit controls the injection current to be injected into said distributed Bragg reflector laser while satisfying a condition for controlling a light output mode of said distributed Bragg reflector laser so that light energy to be inputted into said optical wavelength conversion device in each of periods is constant and satisfying a condition for injecting a current into each of an active area, a phase area, and a distributed Bragg reflector area in each of periods in a mode of constant amount of generated heat so that an injection current-emission wavelength characteristic in the distributed Bragg reflector area is constant.

2. A converter according to claim 1, wherein said control circuit controls the injection current so that a current is injected into the active area in each period in the mode of constant amount of generated heat and a drive current having a multi-valued wavelength of not less than three values is injected into at least one of the distributed Bragg reflector area and the phase area in each period in the mode of constant amount of generated heat.

3. A converter according to claim 2, wherein said control circuit adjusts a current value and an injection time of a drive current by the drive current injected into the distributed Bragg reflector area or the phase area.

4. A converter according to claim 3, wherein said control circuit injects, a first drive current comprising three-valued modulated current including a first modulated current, a second modulated current, and a third modulated current which increase in size in this order, into the distributed Bragg reflector area.

5. A converter according to claim 4, wherein the current injected into the active area, the current injected into the phase area, and the drive current injected into the distributed Bragg reflector area are adjusted so that an emission wavelength of said distributed Bragg reflector laser when one of the first to third modulated currents is injected is closer to a phase adjustment wavelength of the optical waveform conversion device than an emission wavelength of said distributed Bragg reflector laser when other modulated currents of the first to third modulated currents are injected.

6. A converter according to claim 3, wherein said control circuit is configured so that current values constituting the multi-valued wavelength of the drive current are constant for each period, injection times of the current values are variable for each period, and an amount of the second harmonic wave light for each period is adjustable by controlling the injection times.

7. A converter according to claim 1, wherein said optical waveform converter further comprises an optical detector for monitoring an output of the second harmonic wave light.

8. A converter according to claim 7, wherein said optical waveform converter further comprises a second optical detector for monitoring an output of fundamental wave light.

9. A converter according to claim 1, wherein said optical waveform converter further comprises a temperature control circuit provided to at least one of said distributed Bragg reflector laser and said optical waveform conversion device.

10. An optical wavelength conversion method of controlling an emission wavelength and a light output of a distributed Bragg reflector laser by causing fundamental wave light emitted from the distributed Bragg reflector laser having an active area, a phase area, and a distributed Bragg reflector area to enter an optical waveform conversion device so as to output second harmonic wave light of the fundamental wave light and by controlling an injection current to be injected into the distributed Bragg reflector for each period, said method comprising:
controlling the injection current to be injected into the distributed Bragg reflector laser while satisfying a condition for controlling a light output mode of the distributed Bragg reflector laser so that light energy inputted into the optical waveform conversion device in each of periods is constant and a condition for injecting currents into each of the active area, the phase area, and the distributed Bragg reflector area in each of periods in a mode of constant amount of generated heat so that an injection current-emission wavelength characteristic in the distributed Bragg reflector area is constant.

11. An image forming apparatus, comprising:
an optical waveform converter according to claim 1; and
an optical scanning device;
wherein scanning is effected by said optical scanning device with light emitted from said optical waveform converter.

* * * * *

UNITED STATES PATENT AND TRADEMARK OFFICE
CERTIFICATE OF CORRECTION

PATENT NO. : 7,330,490 B2
APPLICATION NO. : 11/474998
DATED : February 12, 2008
INVENTOR(S) : Yukio Furukawa et al.

It is certified that error appears in the above-identified patent and that said Letters Patent is hereby corrected as shown below:

COLUMN 1:
Line 31, "memory" should read --memory,--.
Line 35, "has" should read --have--.

COLUMN 2:
Line 6, "be" should read --been--.
Line 27, "above described" should read --above-described--.

COLUMN 3:
Line 3, "of" should be deleted.
Line 4, "above described" should read --above-described--.
Line 30, "above described" should read --above-described--.
Line 33, "above described" should read --above-described--.

COLUMN 4:
Line 51, "above described" should read --above-described--.
Line 54, "above described" should read --above-described--.

COLUMN 5:
Line 32, "signal" should read --signal).--.
Line 48, "time thin" should read --time $t_{hin}$--.

COLUMN 6:
Line 7, "in" should read --is--.
Line 17, "above described" should read --above-described--.
Line 27, "(current $I_{lo}$" should read --(current $I_{lo}$),--.
Line 30, "an" should read --a--.
Line 55, "with" should read --width--.

COLUMN 7:
Line 66, "include" should read --including--.

UNITED STATES PATENT AND TRADEMARK OFFICE
CERTIFICATE OF CORRECTION

PATENT NO. : 7,330,490 B2
APPLICATION NO. : 11/474998
DATED : February 12, 2008
INVENTOR(S) : Yukio Furukawa et al.

It is certified that error appears in the above-identified patent and that said Letters Patent is hereby corrected as shown below:

COLUMN 8:
Line 24, "above described" should read --above-described--.
Line 35, "include" should read --includes--.
Line 60, "(¾) = (23 ns, 27 ns)," should read --(¾) x (23 ns, 27 ns),--.

COLUMN 9:
Line 29, "at" should read --of--.
Line 36, "above described" should read --above-described--.
Line 39, "(¾) = (23 ns, 27 ns)," should read --(¾) x (23 ns, 27 ns),--.

COLUMN 10:
Line 5, "$I_{hi}$)" should read --$I_{hi}$).--.
Line 35, "detector 502" should read --detector 402--.
Line 61, "fluctuated" should read --fluctuate--.

COLUMN 11:
Line 24, "$\Delta\lambda_{CAVITY}/\lambda_{CAVITY} = (\Delta n_D + L_{Deff} + \Delta nLp + Lp)/(L_{Deff} + Lp + L_G), (4)$" should
read --$\Delta\lambda_{CAVITY}/\lambda_{CAVITY} = (\Delta n_D + L_{Deff} + \Delta nLp + Lp)/n(L_{Deff} + Lp + L_G) (4)$--.
Line 28, "phase" should read --active--.

COLUMN 12:
Line 14, "$\Delta P_{Gain} + \Delta P_{Phase} = 0$ (6)," should read --$\Delta P_{Gain} + \Delta P_{Phase} = 0$ (8),--.

COLUMN 14:
Line 59, "fluctuated" should read --fluctuate--.

COLUMN 17:
Line 25, "above described" should read --above-described--.
Line 32, "above described" should read --above-described--.
Line 38, "above described" should read --above-described--.
Line 63, "period;" should read --period,--.

UNITED STATES PATENT AND TRADEMARK OFFICE
CERTIFICATE OF CORRECTION

PATENT NO. : 7,330,490 B2
APPLICATION NO. : 11/474998
DATED : February 12, 2008
INVENTOR(S) : Yukio Furukawa et al.

It is certified that error appears in the above-identified patent and that said Letters Patent is hereby corrected as shown below:

COLUMN 18:
Line 22, "injects," should read --injects--.

COLUMN 20:
Line 3, "device;" should read --device,--.

Signed and Sealed this

Seventeenth Day of February, 2009

JOHN DOLL
*Acting Director of the United States Patent and Trademark Office*